(12) United States Patent
Liaw

(10) Patent No.: US 12,424,274 B2
(45) Date of Patent: Sep. 23, 2025

(54) MEMORY DEVICE AND MANUFACTURING THEREOF

(71) Applicant: TAIWAN SEMICONDUCTOR MANUFACTURING COMPANY, LTD., Hsinchu (TW)

(72) Inventor: Jhon Jhy Liaw, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 203 days.

(21) Appl. No.: 18/110,321

(22) Filed: Feb. 15, 2023

(65) Prior Publication Data

US 2024/0161819 A1 May 16, 2024

Related U.S. Application Data

(60) Provisional application No. 63/424,259, filed on Nov. 10, 2022.

(51) Int. Cl.
| | |
|---|---|
| *H01L 23/48* | (2006.01) |
| *G11C 11/412* | (2006.01) |
| *H01L 23/528* | (2006.01) |
| *H10B 10/00* | (2023.01) |

(52) U.S. Cl.
CPC .......... *G11C 11/412* (2013.01); *H01L 23/481* (2013.01); *H01L 23/5283* (2013.01); *H10B 10/125* (2023.02)

(58) Field of Classification Search
CPC ... G11C 11/412; H10B 10/125; H01L 23/481; H01L 23/5283
See application file for complete search history.

(56) References Cited

U.S. PATENT DOCUMENTS

| | | | |
|---|---|---|---|
| 8,625,334 B2 * | 1/2014 | Liaw | G11C 11/412 365/189.09 |
| 8,879,305 B2 | 11/2014 | Liaw | |
| 9,613,953 B2 | 4/2017 | Liaw | |
| 9,793,273 B2 | 10/2017 | Liaw | |
| 9,805,985 B2 | 10/2017 | Liaw | |
| 10,170,480 B2 | 1/2019 | Liaw | |
| 11,024,632 B2 | 6/2021 | Liaw | |
| 2016/0351249 A1 * | 12/2016 | Liaw | H01L 27/0924 |
| 2020/0135741 A1 * | 4/2020 | Liaw | G11C 11/419 |
| 2023/0215767 A1 * | 7/2023 | Xie | H01L 27/092 257/329 |

\* cited by examiner

*Primary Examiner* — Min Huang
(74) *Attorney, Agent, or Firm* — Cooper Legal Group, LLC

(57) ABSTRACT

Embodiments of the present disclosure relate to a memory bit cell including two doped regions and four gate structures. Bit line, bit line bar, and word line of the bit cell are formed on a front side of the bit cell and power rails are formed on a back side of the bit cell. In some embodiments, each bit cell includes two word lines.

20 Claims, 22 Drawing Sheets

MEMORY DEVICE AND MANUFACTURING THEREOF

CROSS-REFERENCE TO RELATED APPLICATIONS

This application claims priority to U.S. Provisional Application Ser. No. 63/424,259 filed Nov. 10, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. Although existing semiconductor devices and methods of fabricating semiconductor devices have been generally adequate for their intended purposes, they have not been entirely satisfactory in all respects. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
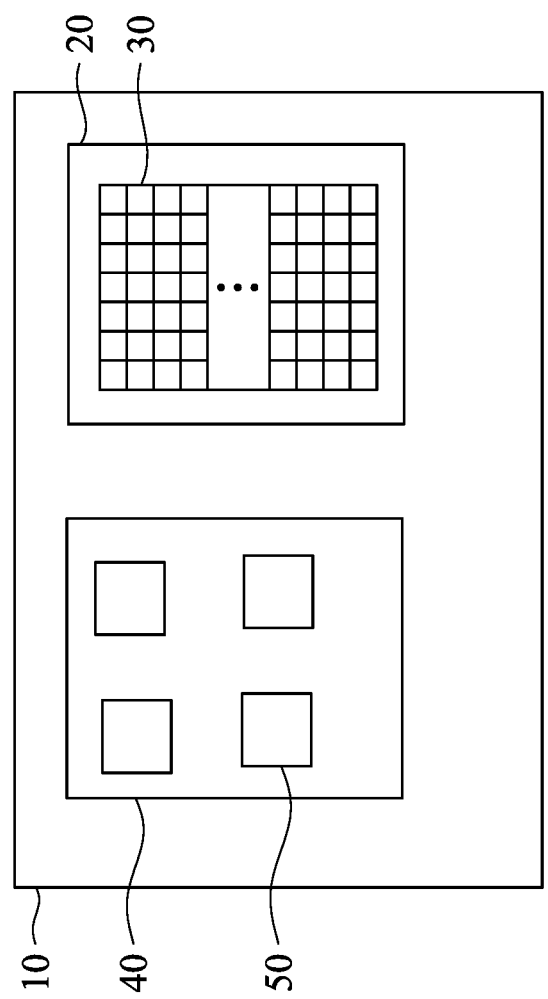
FIG. 1 is a simplified diagram of an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, GAA (Gate All Around) FETs, such as Horizontal Gate All Around (HGAA) FETs, and Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. Source/drain region(s) may refer to a source or a drain, individually or collectively dependent upon the context.

Embodiments of the present disclosure relate to a SRAM (static random-access memory) bit cell. Particularly, embodiments of the present disclosure relate to a SRAM bit cell with back side power rail. The SRAM bit cell according to the present disclosure has a cell height in bit-line routing direction is equal to 4 times of the gate pitch. The SRAM bit cell are formed on two doped regions, or active regions. In some embodiments, bit-line, bit-line-bar and word-line conductors all located on the front-side of the transistors, and power rail, such as CVSs conductors, are located on a back side of the transistors. In some embodiments, bit-line and bit-line-bar conductors are located on different interconnect layers. In some embodiments, local interconnect features, such as gate contact features and source/drain contact features are located in a first interconnect layer on the front side, bit-line and bit-line-bar conductors are located in the third interconnect layer on the front side, and word-line conductors are located in second interconnect layer.

FIG. 1 is a simplified diagram of an integrated circuit 10 in accordance with some embodiments of the present disclosure. The integrated circuit 10 includes a memory circuit 20 and a logic circuit 40. In some embodiments, the memory circuit 20 and logic circuit 40 include GAA transistors.

The memory circuit 20 may include one or more memory array 30 of multiple memory cells arranged in rows and columns. In some embodiments, the memory cells in the memory array 30 may have the same circuit configuration and the same semiconductor structure. In some embodiments, the logic circuit 40 may be the controller for accessing the memory circuit 20. In some embodiments, the logic circuit 40 includes circuits configured to perform a specific function or operation according to data stored in the memory circuit 20. The logic circuit 40 includes multiple logic cells 50. In some embodiments, the logic cell 50 may be a standard cell (STD cell), e.g., inverter (INV), AND, OR, NAND, NOR, Flip-Flop, SCAN and so on. In some embodiments, the logic cells 50 corresponding to the same function or operation may have the same circuit configuration with different semiconductor structures for providing various threshold voltages (Vth or Vt). In some embodiments, the integrated circuit 10 may be a system on chip (SOC) circuit with embedded memory circuits.

Figure 2A:
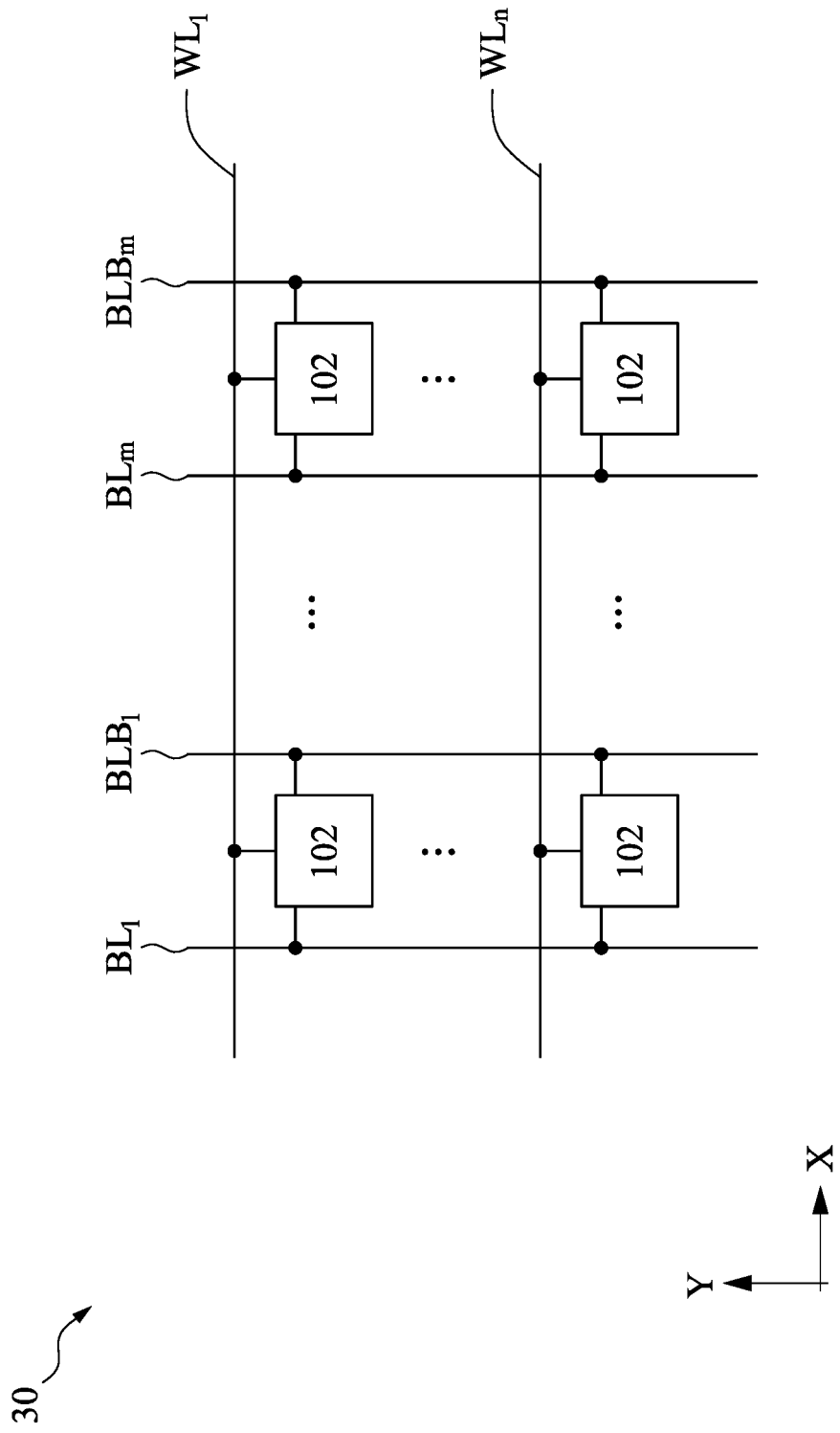
FIG. 2A schematically illustrates an array of memory cells arranged in rows and columns according to the embodiments of the present disclosure.

FIG. 2A schematically illustrates the memory array 30 the embodiments of the present disclosure. In some embodiments, the memory array 30 is a "SRAM" array including a plurality of bit cells 102. The bit cells 102 are arranged in a number, n, of rows and a number, m, of columns. Each bit cell 102 is coupled to a word line, WL (one of $WL_1$ to $WV_{LN}$), that extends horizontally across the memory array 30 (i.e., in an x-direction) and two complementary bit-line BL (one of $BL_1$ to $BL_m$) and complement bit-line-bar BLB (one of $BLB_1$ to $BLB_m$) that extend vertically across the memory array 30 (i.e., in a y-direction).

Figure 2B:
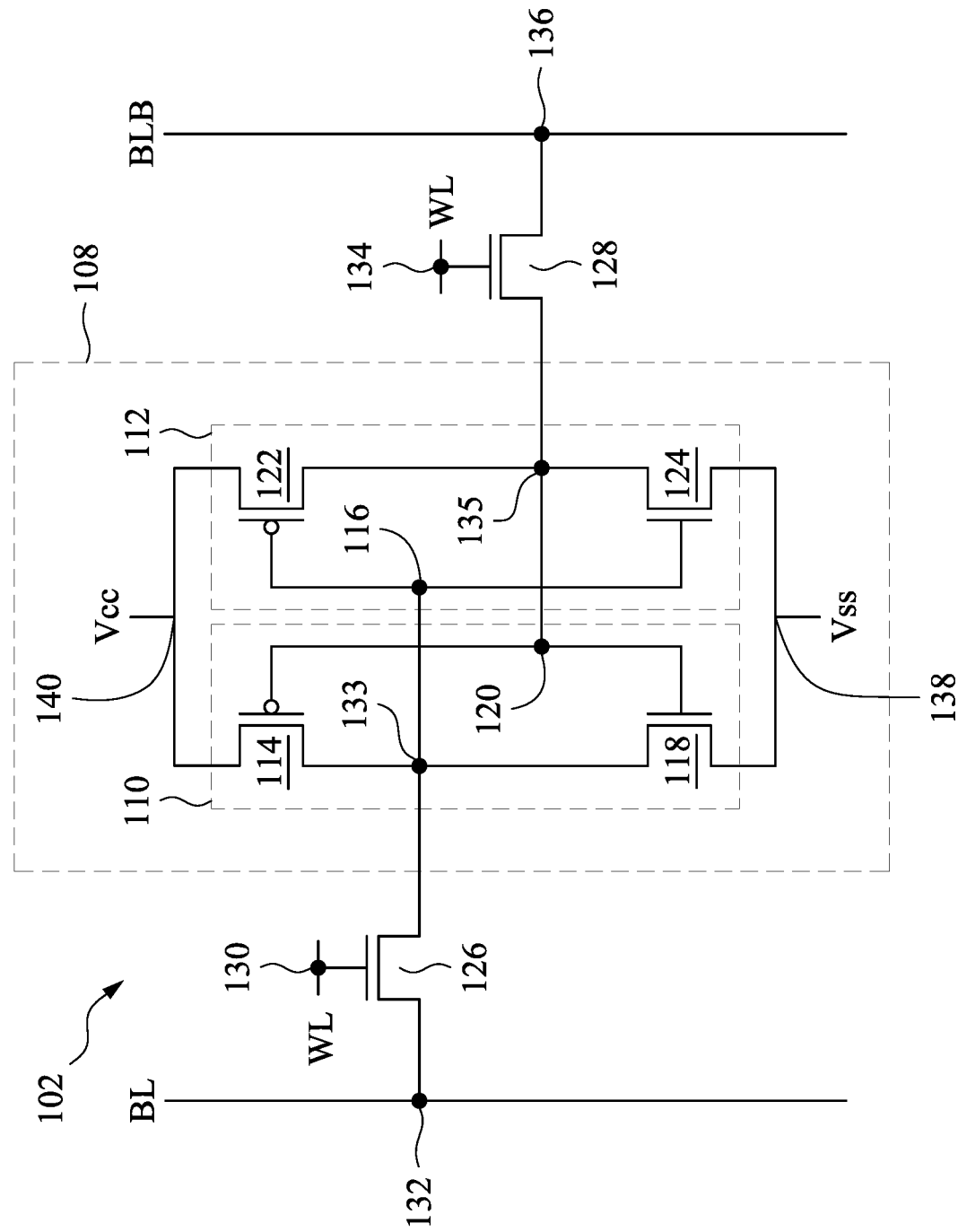
FIG. 2B schematically illustrates one example of a SRAM memory bit cell according to embodiments of the present disclosure.

FIG. 2B is a schematic diagram of the bit cell 102 according to embodiments of the present disclosure. The bit cell 102 is a six-transistor ("6T") SRAM cell. Each bit cell 102 includes a latch 108 formed by a pair of cross coupled inverters 110, 112. The inverter 110 includes a PMOS (p-channel metal-oxide semiconductor) transistor 114 and a NMOS (n-channel metal-oxide semiconductor) transistor 118. The PMOS transistor 114 includes a source coupled to the supply voltage Vcc at a node 140, and a drain coupled to a node 133. The node 133 is connected to a node 116. The node 116 serves as the output of the inverter 110. The NMOS transistor 118 of the inverter 110 has a source coupled to the ground Vss at a node 138, and a drain coupled to the node 133, which connected to the node 116. Gates of the transistors 114 and 118 are coupled together at a node 120. The node 120 serves as the input of the inverter 110 and the output of the inverter 112. The inverter 112 includes a PMOS transistor 122 and a NMOS transistor 124. The PMOS transistor 122 has a source coupled to VDD at a node 140, a gate coupled to the node 116, and a drain coupled to a node 135. The node 135 is connected to the node 120. The NMOS transistor 124 has a source coupled to the ground Vss at the node 138, a drain coupled to the node 135, which connected to the node 120, and a gate coupled to the node 116.

The bit cell 102 also includes a pair of pass transistors 126, 128. In some embodiments, the pass transistors 126, 128 are NMOS transistors, although one skilled in the art will understand that the pass transistors 126, 128 may be implemented as PMOS transistors. The pass transistor 126 has a gate coupled to the word line WL at a node 130, a source coupled to the node 133 and the node 116, and a drain coupled to the bit line BL at a node 132. The transistor 128 has a gate coupled to the word line WL at a node 134, a source coupled to the node 135 and the node 120, and a drain coupled to the complementary bit line BLB at a node 136.

In some embodiments, the transistors of the bit cell 102 may be GAA FETs, such as HGAA-FETs, VGAA FETs, and other suitable devices. Alternatively, the transistors of the bit cell 102 may be formed in any suitable transistors, such as bulk planar metal oxide field effect transistors ("MOS-FETs"), bulk Fin-FETs having one or more fins or fingers, semiconductor on insulator ("SOI") planar MOSFETs, SOI Fin-FETs having one or more fins or fingers, or combinations thereof. The gates of the transistors in the bit cell 102 may include a polysilicon ("poly")/silicon oxynitride ("SiON") structure, a high-k/metal gate structure, or combinations thereof. Examples of the semiconductor substrate include, but are not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof.

Figure 3:
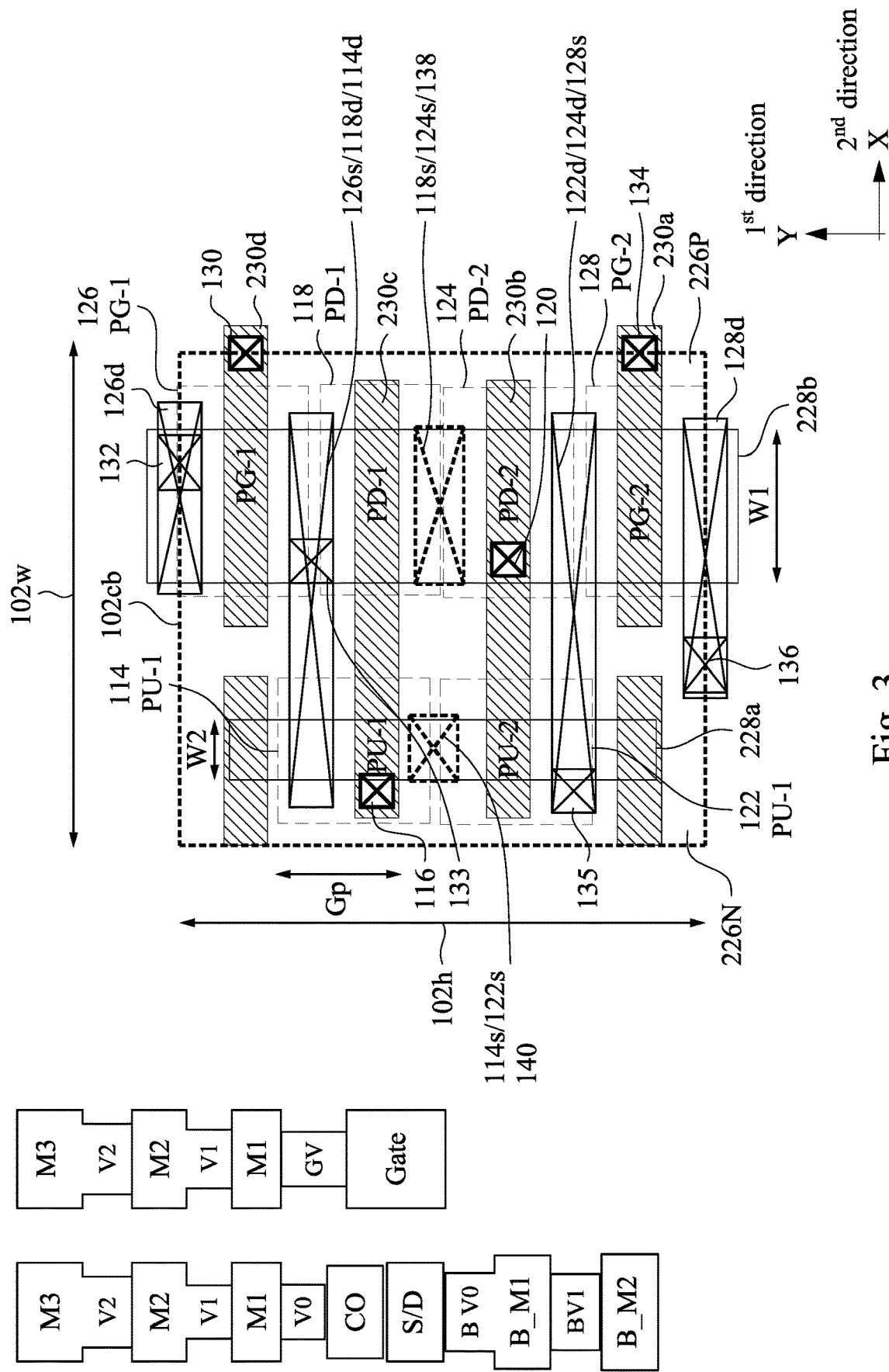
FIG. 3 is a schematic view of transistor layout of a SRAM bit cell according to embodiments of the present disclosure.

FIG. 3 is a schematic view of transistor layout of a SRAM bit cell 102 according to embodiments of the present disclosure. Legend in FIG. 3 schematically demonstrates various layers of semiconductor devices, such as the bit cell 102. Particularly, the bit cell 102 may include a S/D layer, a contact layer CO over the S/D layer, and a gate overlapping and interweaving with the S/D layer and contact layer CO. The gate layer and the contact layer are connected to a front side interconnect structure by via layers V0 and Gv respectfully. The front side interconnect structure includes multiple dielectric layers of dielectric materials with alternate layers of conductive lines and vias embedded therein, for example conductive layers M1, M2, M3 and via layers V1, V2 are alternatively disposed. The front side interconnect structure may include additional conductive layers and via layers. In some embodiments, the bit cell 102 may include a back side interconnect structure connected to the S/D layer by a back side contact layer B_CO and a via layer B V0. The back side interconnect structure includes multiple dielectric layers of dielectric materials with alternate layers of conductive lines and vias embedded therein, for example conductive layers B_M1, B_M2 and a via layer B_V1 are alternatively disposed. In some embodiments, the bit cell 102 include bit line conductors and word line conductors in the front side interconnect structure and power rail in the back side interconnect structure.

As shown in FIG. 3, the bit cell 102 is formed within the cell boundary 102cb having a cell height 102h that extends in the y-direction, or the first direction, and a cell width 102w that extends in the x-direction, or the second direction. As discussed above, the transistors of the bit cell 102 are formed over two doped regions 226N, 226P of a semiconductor substrate with four parallel gate structures 230a, 230b, 230c, 230d across the two doped regions 226, 226P. The dope regions 226N, 226P are positioned side by side and extend along the first direction. Two fin structures 228a, 220b respectfully are formed in the doped regions 226N, 226P along the first direction. The gate structures 230a, 230b, 230c, 230d are formed along the second direction across the fin structures 228a, 220b. In some embodiments, the gate structures 230a, 230b, 230c, 230d are equally disposed across the bit cell 102 and along the second direction at a gate pitch Gp. In some embodiments, the cell height 102h is four times the gate pitch Gp. In some embodiments, a ratio of the cell width 102w over the cell height 102h is in a range between about 0.4 and 1.2. In some embodiments, a ratio of the cell width 102w over the cell height 102h is in a range between about 0.4 and 1.0.

The transistors 114, 118, 122, 124, 126, and 128 of the bit cell 102 are formed over the doped regions 226P, 226N. The fin structures 228a, 228b are formed along the y-direction. The gate structures 230a, 230b, 230c, 230d are formed along the x-direction over the fin structures 228a, 228b. In some embodiments, each of the fin structures 228a, 228b includes two or more nano-sheet semiconductor channels. During fabrication, portions of the fin structures 228a, 228b not covered by the gate structures 230a, 230b, 230c, 230d are etched back, and epitaxial source/drain structures are then formed on both sides of the gate structures 230a, 230b, 230c, 230d to form the transistors 114, 118, 122, 124, 126, and 128.

The fin structure 228b is formed over the doped region 228P respectively. The fin structures 228b may have a width w1 along the x-direction. The fin structure 228a is formed over the n-well 226n. The fin structure 228a may have a width w2 along the x-direction. In some embodiments, the width w1 is greater than the width w2. In some embodiments, in an array of bit cells 102, the fin structure 228b is formed continuously along the y-direction, and the fin structure 228a is formed in sections in each bit cell 102. The gate structures 230b, 230c are formed in a middle portion of the bit cell 102 across both the fin structures 228a, 228b. The gate structures 230a, 230d are formed above and below the gate structures 230b, 230c. The gate structures 230a, 230d cross the fin structure 220b. In some embodiments, the gate structures 230a, 230c terminate at a position between the fin structures 228a and 228b. In some embodiments, the gate structures 239a, 230d include dummy portions covering ends of the fin structure 228a.

The pull-down transistors 118, 124 and the pass transistors 126, 128 are n-type transistors formed over the doped region 226P. The pull-up transistors 114 and 122 are p-type transistors formed over the doped region 226N. The pull-down transistor 118 and the pull-up transistor 114 share the same gate structures 238c. The pull-down transistor 124 and the pull-up transistor 122 share the same gate structures 238b.

Source/drain contact features 114d, 118d, 122d, 124s, 124d, 126s, 126d, 128s, 128d are formed over on epitaxial source/drain features of the transistors 114, 118, 122, 124, 126, 128 in the contact layer CO. In some embodiments, the source/drain contact features 126s, 118d, 114d are connected to one another, and the source/drain contact features 122d, 124d, 128s are connected together. The nodes 116, 120, 130, 134 may be implemented in form of gate contacts in the gate via layer GV. In some embodiments, source/drain contact feature 114s/122s, 118s/124s are formed under the epitaxial source/drain features of the transistors 114, 122, 118, 124. The nodes 140, 138 may be implemented in form of contact vias in the back side contact layer B_CO or the back side via layer B V0. The nodes 130, 134.

Figure 4A:
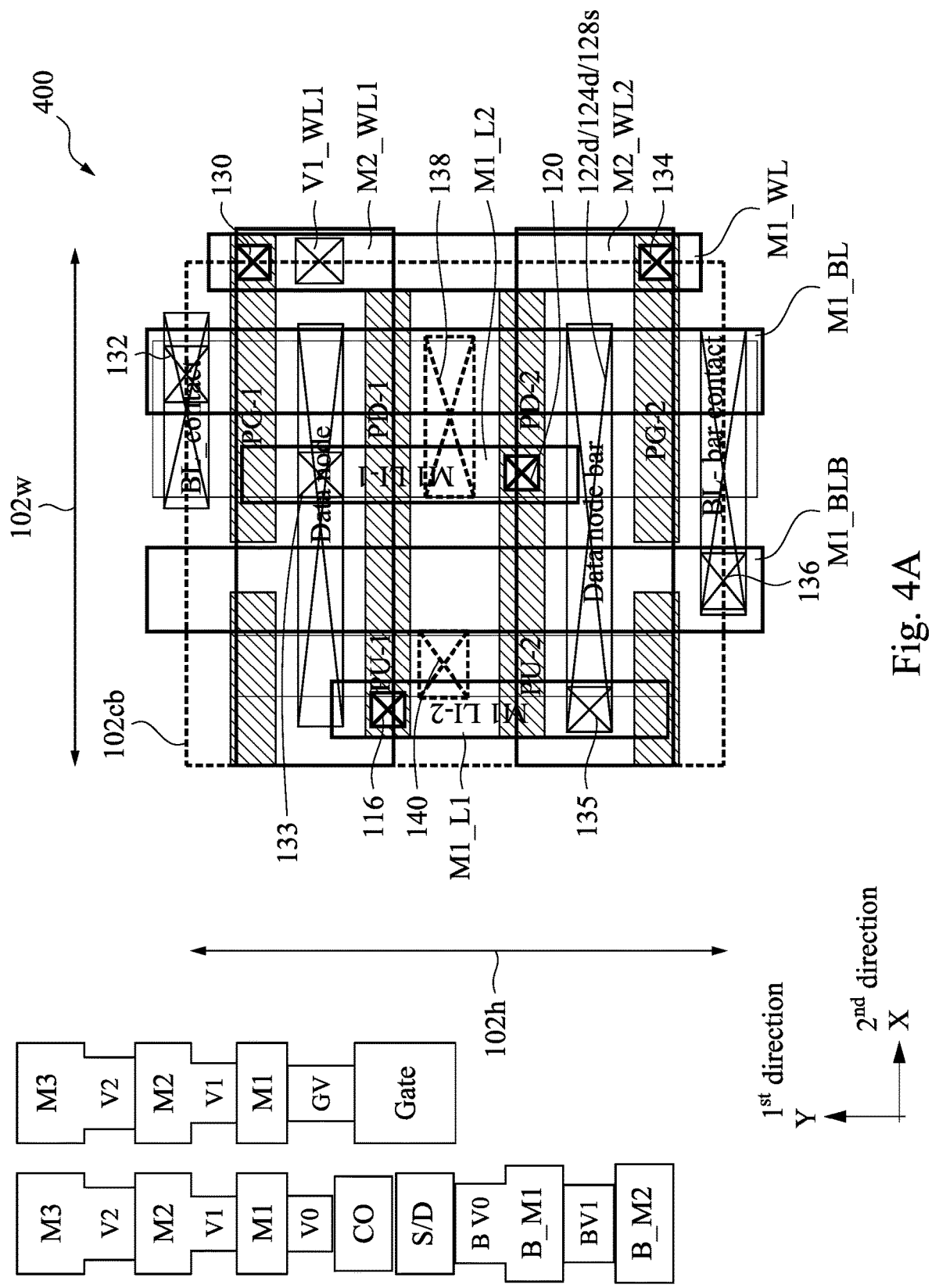
FIG. 4A is a schematic front side interconnect layout for the SRAM bit cell according to the present disclosure.
Figure 4B:
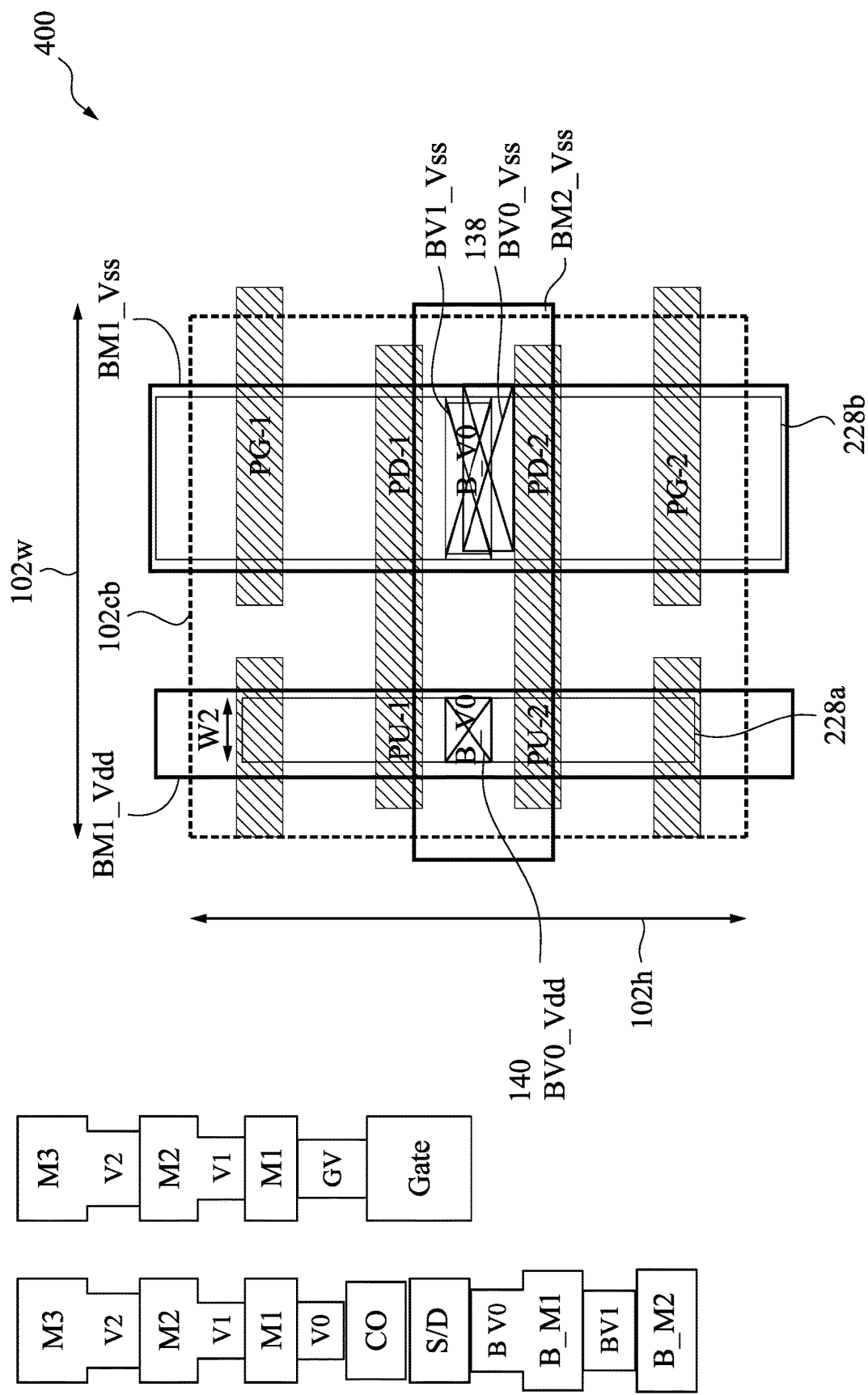
FIG. 4B is a schematic back side interconnect layout for the SRAM bit cell according to the present disclosure.
Figure 4C:
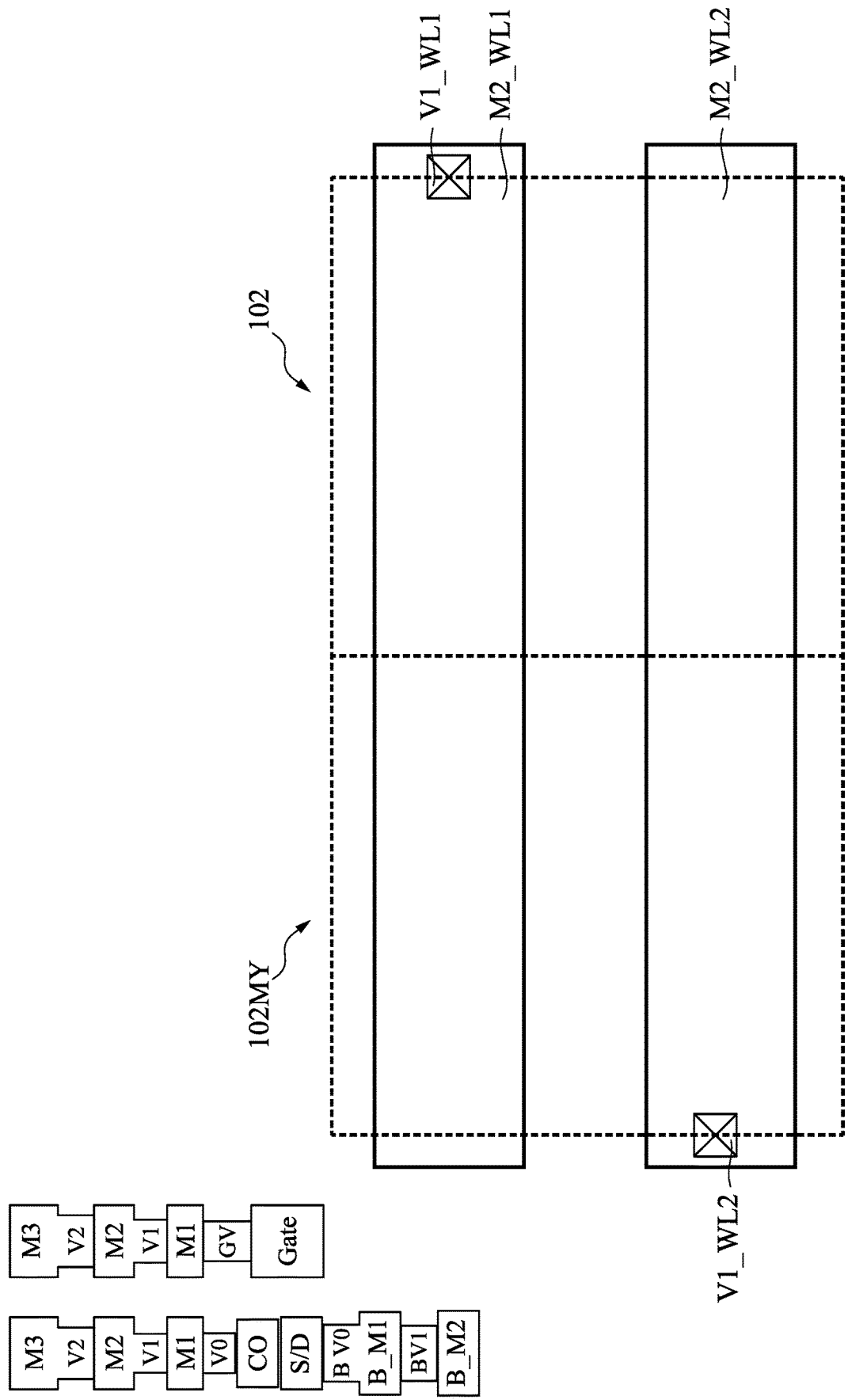
FIG. 4C is a schematic word line layout for two SRAM bit cells according to the present disclosure.
Figure 4D:
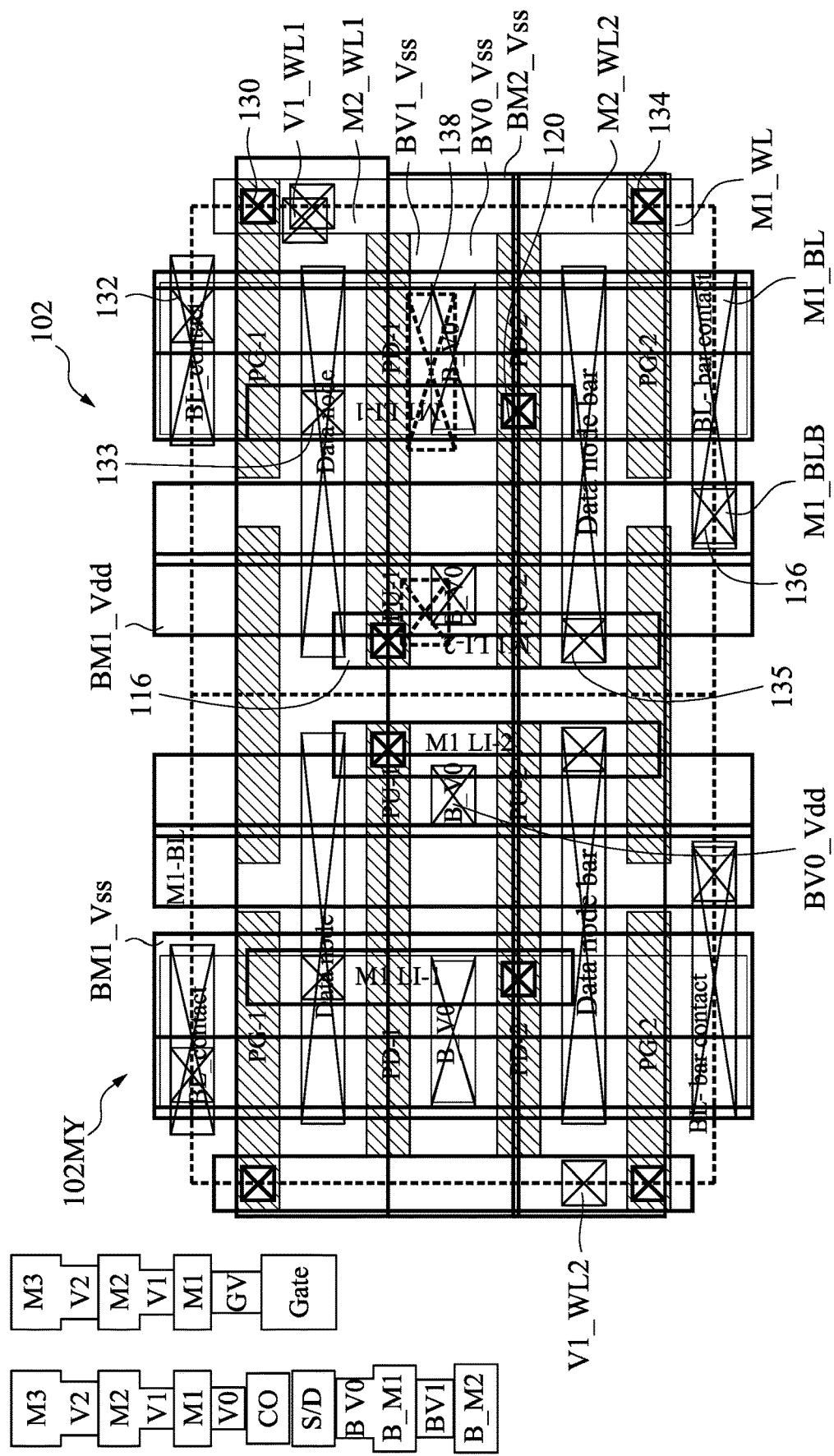
FIG. 4D is a schematic interconnect layout for two SRAM bit cells according to the present disclosure.

As discussed above, the bit cell 102 according to the present disclosure includes both a front side interconnect structure and a back side interconnect structure. In some embodiments, the back side interconnect structure includes a power rail, and the front side interconnect structure includes bit line, bit line bar, and word line. FIGS. 4A-4D schematically demonstrate an interconnect layout 400 according to embodiments of the present disclosure. FIG. 4A is a schematic front side interconnect layout for the SRAM bit cell 102 according to the present disclosure. FIG. 4B is a schematic back side interconnect layout for the SRAM bit cell 102 according to the present disclosure. FIG. 4C is a schematic word line layout for two SRAM bit cells according to the present disclosure. FIG. 4D is a schematic interconnect layout for two SRAM bit cells according to the present disclosure.

FIG. 4A schematically demonstrates the conductive layers M1, M2 of the front side interconnect structure of the bit cell 102. Bit line and bit line bar are formed in the first conductive layer M1, i.e. the lowest level of conductive layer. And the word line is formed in the second conductive layer M2. The first conductive layer M1 is formed immediately above the gate via layer GV and the via layer V0. The first conductive layer M1 include a conductive line M1_BL and a conductive line M1_BLB extend along the first direction. The conductive line M1_BL is connected to the node 132 in the via layer V0 and function as the bit line of the bit cell 102. The conductive line M1_BLB is connected to the node 136 in the via layer V0 and functions as the bit line bar of the bit cell 102. The conductors M1_BL and M1_BLB extend the cell height 102h of the bit cell 102.

The first conductive layer M1 further includes conductors M1_L1 and M1_L2 positioned to connect the nodes 116 and 135, and the nodes 120 and 133 respectively. The conductors M1_L1 and M1_1_2 are positioned parallel to the conductors M1_BL and M1_BLB.

The first conductive layer M1 further include a conductive line M1_WL, which is connected to the nodes 130, 134 in the gate via layer GV. The conductive line M1_WL functions word line landing to connect the word line in the upper conductive layer. In some embodiments, the conductive line M1_WL is formed on the cell boundary 102cb and shared with the neighboring bit cell.

The via layer V1 is formed over the first conductive layer M1. In some embodiments, a conductive via V1_WL is formed in the via layer V1 and in contact with the conductive line M1_WL. The conductive layer M2 is formed over the via layer V1. The conductive layer M2 includes a conductive line M2_WL1 and a conductive line M2_WL2. The conductive line M2_WL1 and conductive line M2_WL2 are parallel to each other and extend along the first direction. The conductive line M2_WL1 is in electrical connection with the conductive via V1_WL and conductive line M1_WL and functions as the word line for the bit cell 102. The conductive line M2_WL2 is configured to function as the word line for the bit cells on both sides of the bit cell 102 along the x-direction. FIG. 4C schematically demonstrates the word line arrangement of the bit cell 102 and a bit cell 102MY. The bit cell 102MY is disposed to the left of the bit cell 102 and is a mirror image of the bit cell 102 about the Y-axis. As shown in FIG. 4C, the conductive line M2_WL1 is the word line of the bit cell 102 and the conductive line M2_WL2 is the word line of the bit cell 102MY.

FIG. 4B schematically demonstrates arrangement of a via layer B_V0, a conductive layer B_M1, via layer B_V1, and a conductive layer B_M2 of the back side interconnect structure of the bit cell 102. As discussed in FIG. 3, the nodes 138, 140 are connected to the source/drain contact features from the back. In FIG. 4B, the nodes 138, 140 are implemented in the form of conductive vias BV0_Vss and BV0_Vdd in the back side via layer B_V0. The conductive layer B_M1 is formed next to the via layer B_V0.

The conductive layer B_M1 includes a conductive line BM1_Vss and a conductive line BM1 Vdd extend along the first direction. The conductive line BM1_Vss is connected to the node 138/BV0_Vss in the via layer B_V0 and functions a conductive routing line to connect the pull-down transistors 118, 124 to the ground. The conductive line BM1 Vdd is connected to the node 140/BV0_Vdd in the via layer V0 and functions as a routing line to connect the pull-up transistors 114, 122 to the supply voltage Vcc. The conductive line BM1_Vss and BM1_Vdd extend the cell height 102h of the bit cell 102.

The via layer B_V1 is formed under the conductive layer B_M1. In some embodiments, a conductive via BV1_Vss is formed in the via layer B_V1 and in contact with the conductive line BM1_Vss. The conductive layer B_M2 is formed under the via layer B_V1. The conductive layer B_M2 includes a conductive line BM2_Vss. The conductive line BM_Vss extends along the second direction across the bit cell 102. The conductive line BM2_Vss, the conductive via BV1_Vss, and the conductive line BM1_Vss form a power mesh connecting the pull-down transistors 118, 124 to the ground.

In some embodiments, the bit cell 102 are arranged in an array with neighboring bit cells arranged in pairs. The two bit cells 102 in each pair are mirror images of each other, as shown in FIG. 4D.

Figure 5A:
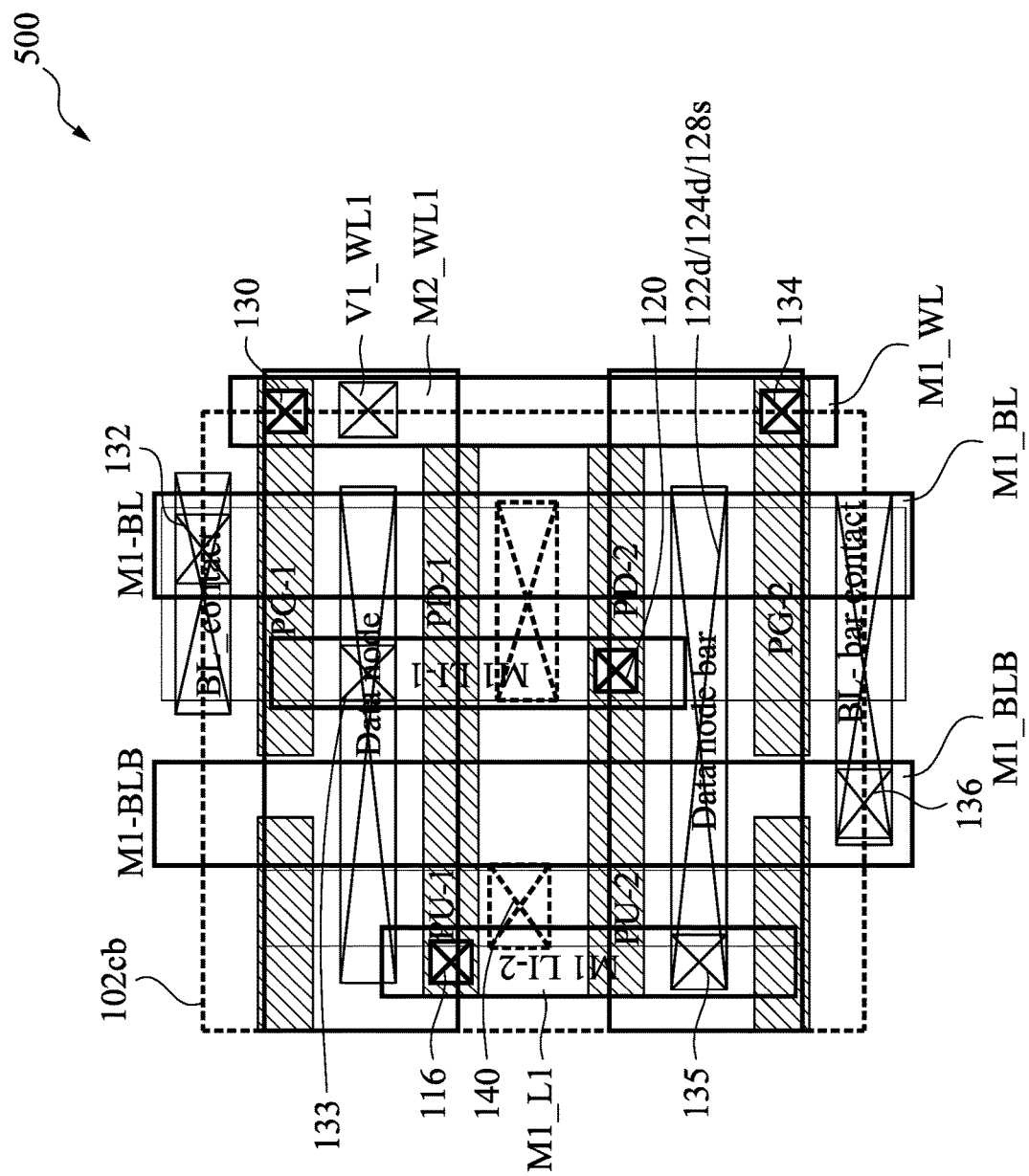
FIG. 5A is a schematic front side interconnect layout for the SRAM bit cell according to the present disclosure.
Figure 5A:
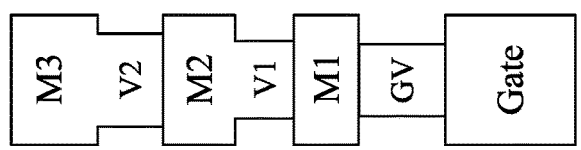
Figure 5A:
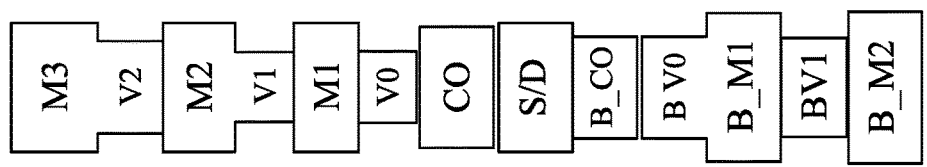
Figure 5B:
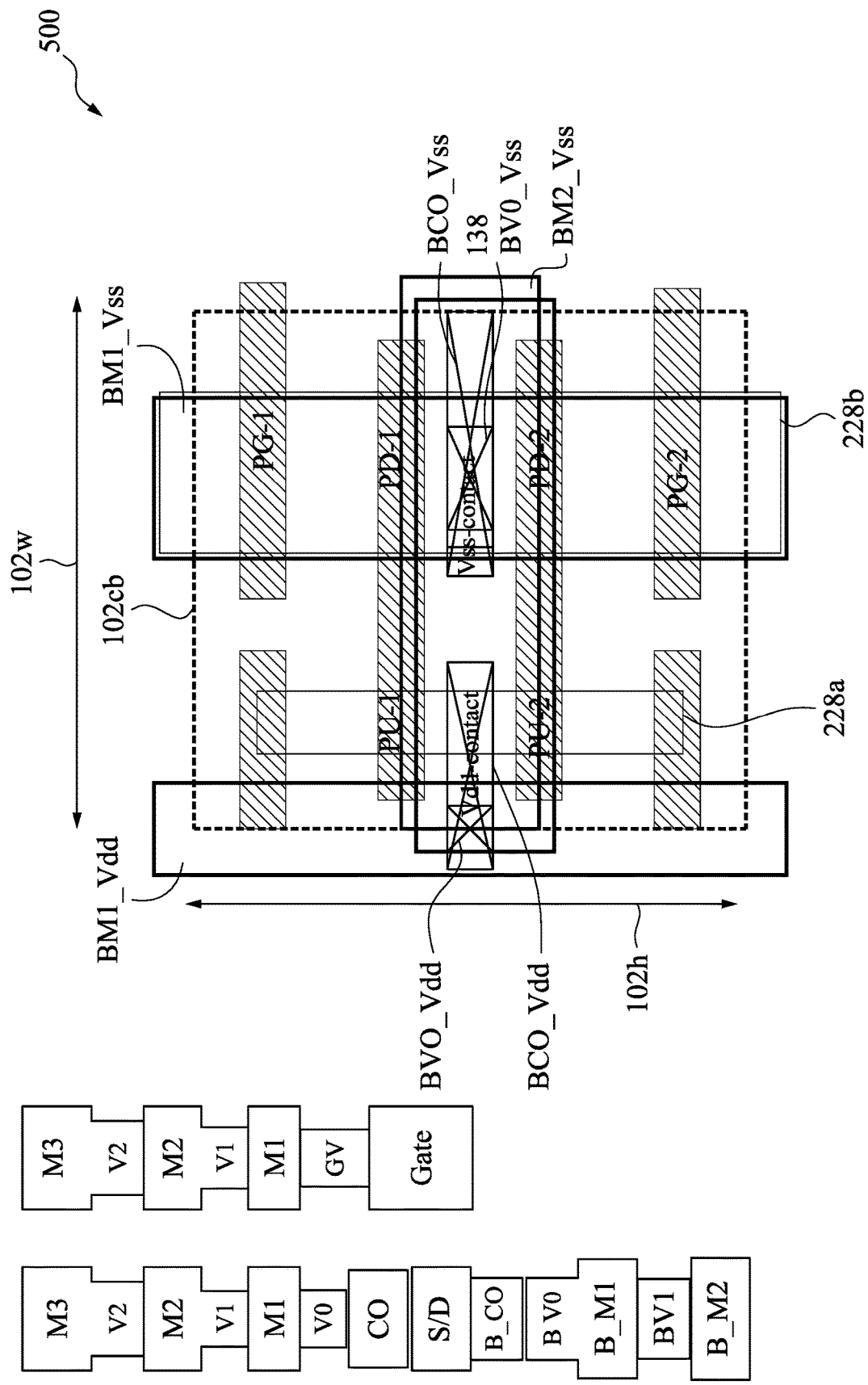
FIG. 5B is a schematic back side interconnect layout for the SRAM bit cell according to the present disclosure.

FIGS. 5A-5B schematically demonstrate an interconnect layout 500 according to another embodiment of the present disclosure. FIG. 5A is a schematic front side layout of the interconnect layout 500. FIG. 5B is a schematic back side layout of the interconnect layout 500. The interconnect layout 500 in FIGS. 5A-5B is similar to the layout 400 in FIGS. 4A-4D except the layout 500 includes a back side contact layer B_CO disposed between the S/D layer and the via layer B_V0. In some embodiments, conductive lines BCO_Vss and BCO_Vdd. In some embodiments, the conductive lines BCO_Vss and BCO_Vdd extend along the second direction. The conductive lines BCO_Vss and BCO_Vdd allow the conductive vias BV0_Vss and BV0_Vdd to be disposed at desirable locations in the x-direction. As shown in FIG. 5B, the conductive lines BCO_Vss and BCO_Vdd allow the conductive lines BM1_Vss and BM1 Vdd to be further apart or evenly distributed.

Figure 6A:
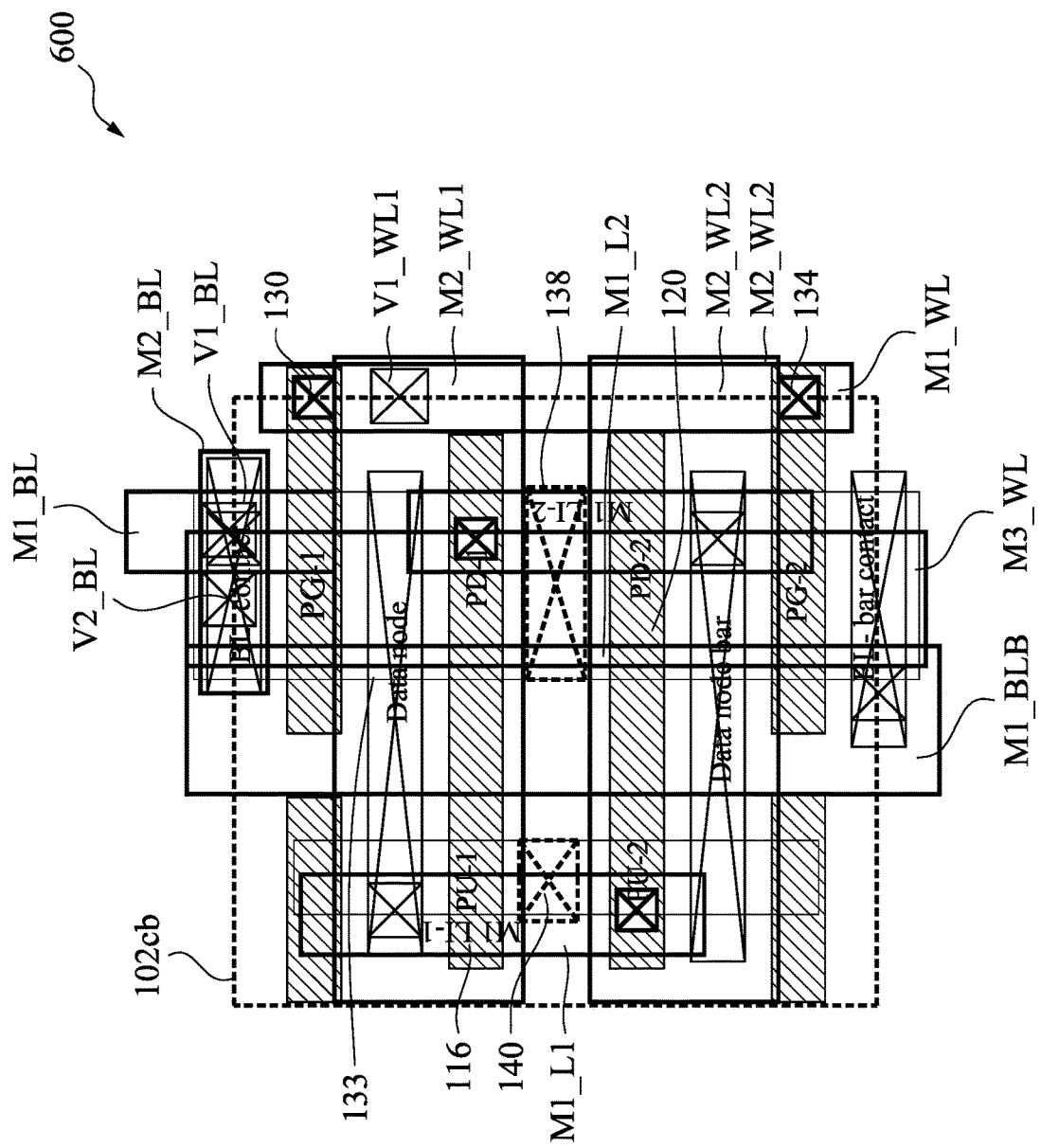
FIG. 6A is a schematic front side interconnect layout for the SRAM bit cell according to the present disclosure.
Figure 6A:
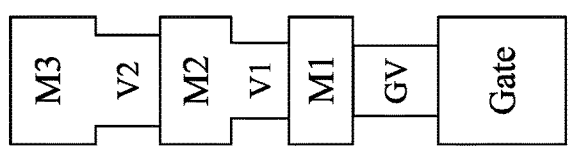
Figure 6A:
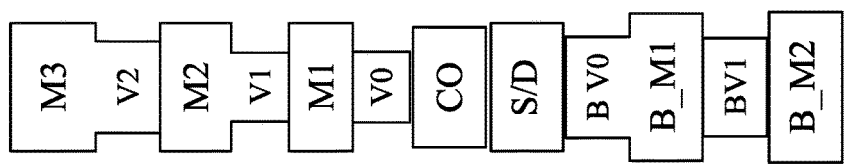
Figure 6B:
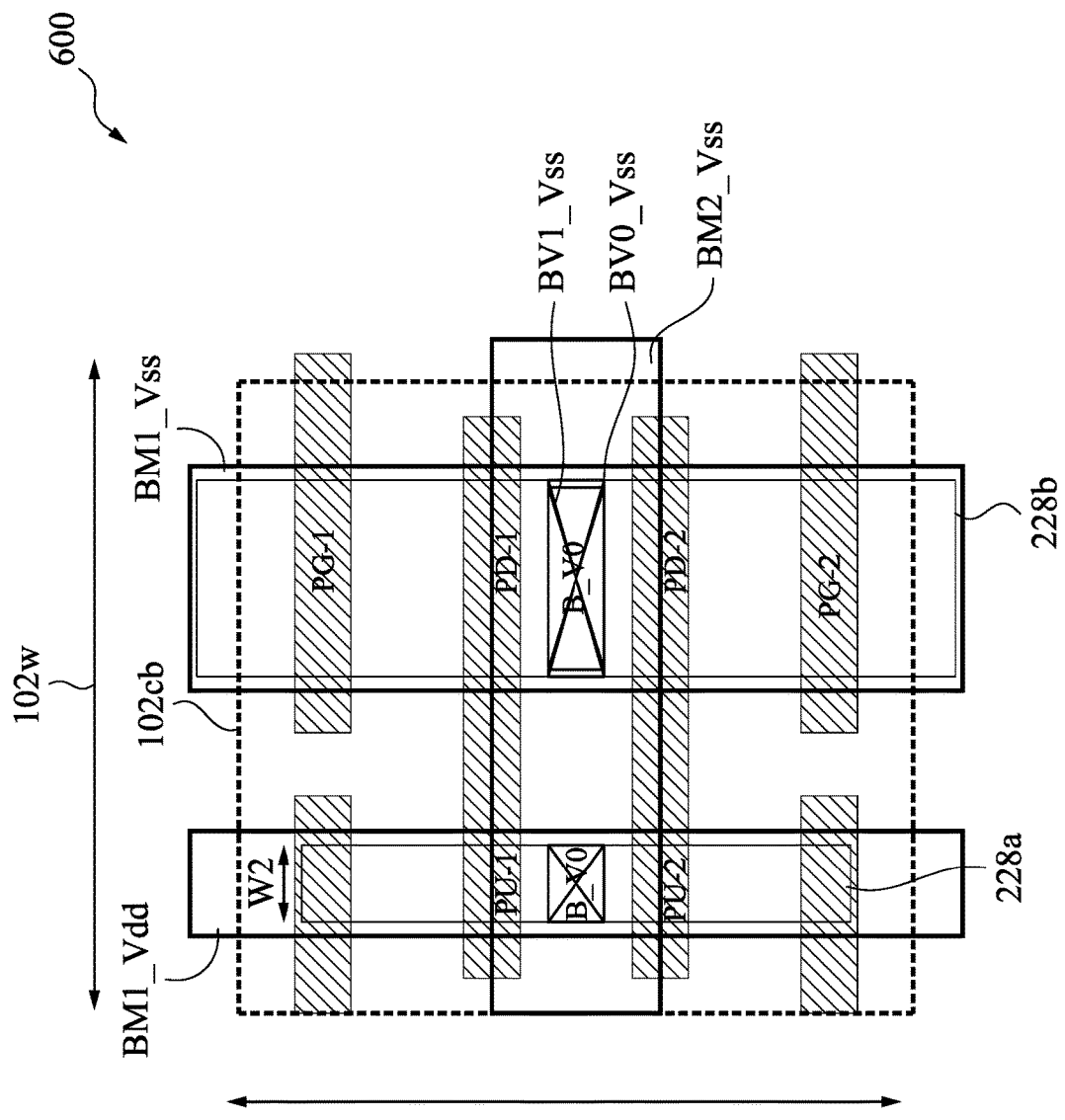
FIG. 6B is a schematic back side interconnect layout for the SRAM bit cell according to the present disclosure.
Figure 6B:
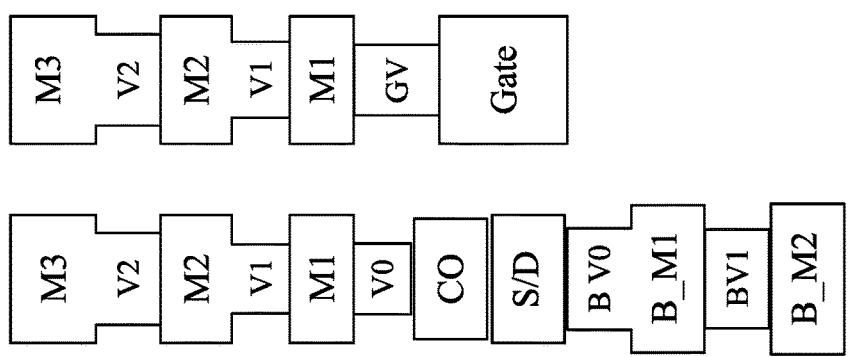
Figure 6C:
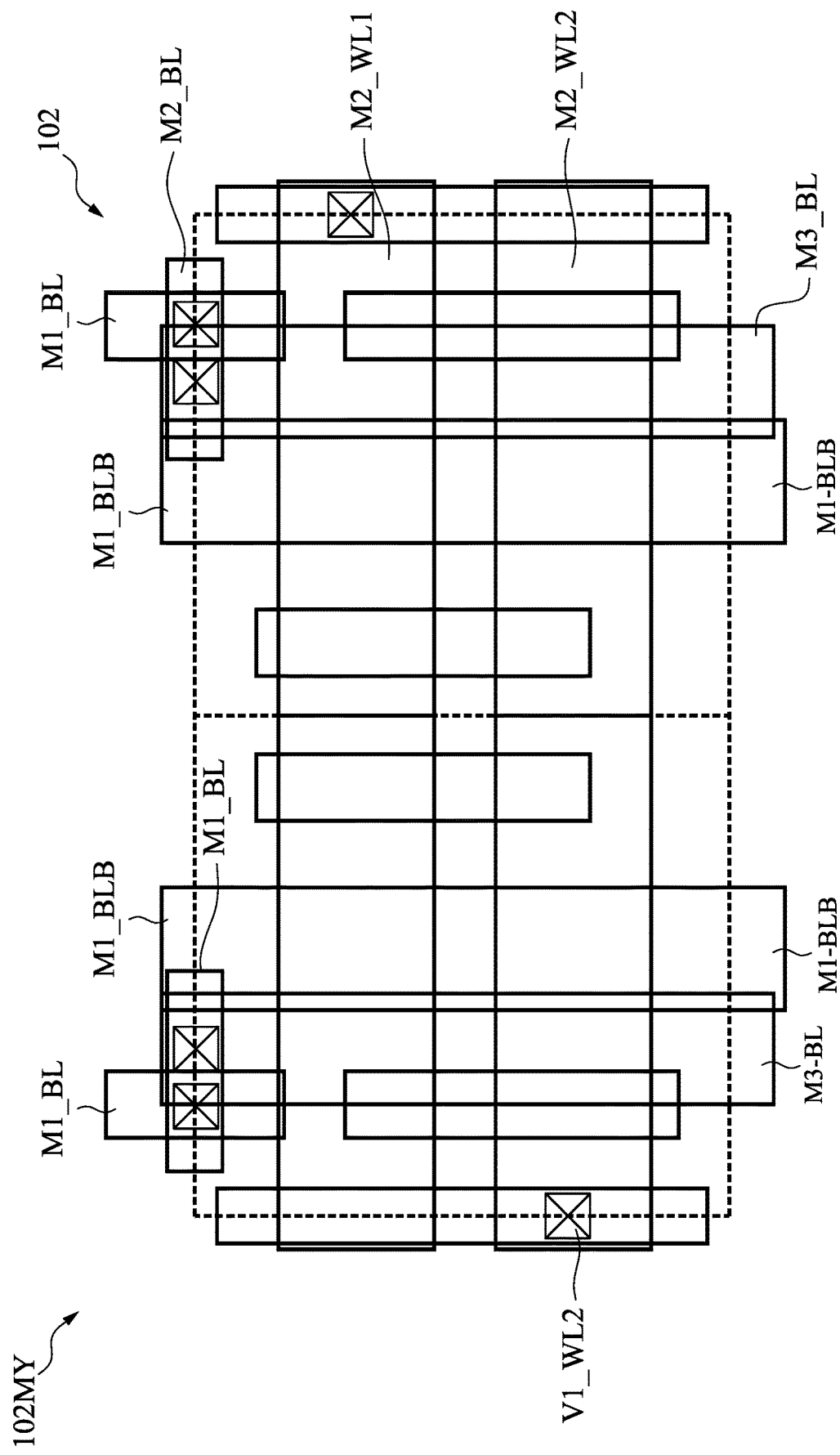
FIG. 6C is a schematic back side interconnect layout for two SRAM bit cells according to the present disclosure.

FIGS. 6A-6C schematically demonstrate an interconnect layout 600 according to embodiments of the present disclosure. FIG. 6A is a schematic front side layout of the interconnect layout 600 according to the present disclosure. FIG. 6B is a schematic back side layout of the interconnect layout 600. FIG. 6C is a schematic word line layout of the interconnect layout 600. The interconnect layout 600 is similar to the interconnect layout 400 except that the bit line conductor and the bit line bar conductor are positioned in different conductor layers. In some embodiments, the bit line and bit line bar are disposed in conductive layers above and below the word line conductors. In some embodiments, one of the bit line and bit line bar is disposed in the first conductive layers. For example, the bit line bar is positioned in the conductive layer M1 and the bit line is positioned in the conductive layer M3, while the word line conductors are disposed in the conductive layer M2. Alternatively, the bit line is positioned in the conductive layer M1 and the bit line bar is positioned in the conductive layer M3.

FIG. 6A schematically demonstrates the conductive layers M1, M2, M3 of the front side interconnect structure of the bit cell 102. The first conductive layer M1 include a conductive line section M1_BL and a conductive line M1_BLB. The conductive line M1_BL is contact with the node 132 in the via layer V0. The conductive line M1_BL is a line section serving as bit line landing in the conductive layer M1. The conductive line M1_BLB is connected to the node 136 in the via layer V0. The conductive line M1_BLB extends across the bit cell 102 along the first direction and functions as the bit line bar for the bit cell 102. In some embodiments, the conductive line M1_BLB in the layout 600 is wider than the conductive line M1_BLB in the layout 400.

The first conductive layer M1 further includes conductive lines M1_L1 and M1 L2 positioned to connect the nodes 116 and 135, and the nodes 120 and 133 respectively. The conductors M1_L1 and M1_L2 are positioned parallel to the conductive lines M1_BL and M1_BLB. In some embodiments, the conductive lines M1 L2 and M1_BL is positioned is aligned with each other. The first conductive layer M1 further include a conductive line M1_WL, which is connected to the nodes 130, 134 in the gate via layer GV. The conductive line M1_WL functions word line landing to connect the word line in the upper conductive layer. In some embodiments, the conductive line M1_WL is formed on the cell boundary 102cb and shared with the neighboring bit cell.

The via layer V1 is formed over the first conductive layer M1. In some embodiments, a conductive via V1_WL is formed in the via layer V1 and in contact with the conductive line M1_WL. The conductive layer M2 is formed over the via layer V1. The conductive layer M2 includes a conductive line M2_WL1 and a conductive line M2_WL2. The conductive line M2_WL1 and conductive line M2_WL2 are parallel to each other and extend along the first direction. The conductive line M2_WL1 is in electrical connection with the conductive via V1_WL and conductive line M1_WL and functions as the word line for the bit cell 102. The conductive line M2_WL2 is configured to function as the word line for the bit cells on both sides of the bit cell 102 along the x-direction.

In some embodiments, a conductive via V1_BL is formed in the via layer V1 and in contact with the conductive line M1_BL. The conductive layer M2 includes a conductive line M2_BL. The conductive line M2_BL is connected to the conductive via V1_ BL. The conductive line M2_BL may be line section extending along the second direction, or parallel to the word lines M2_WL1 and M2_WL2.

The via layer V2 is formed over the second conductive layer M2. In some embodiments, a conductive via V2_BL is formed in the via layer V2 and in contact with the conductive line M2_BL. The conductive layer M3 is formed over the via layer V2. The conductive layer M3 includes a conductive line M3_BL. The conductive line M3_BL extends across the bit cell 102 along the first direction, or parallel to the conductive line M1_BLB. The conductive line M3_BL functions as the bit line for the bit cell 102.

FIG. 6B schematically demonstrates arrangement of a via layer B_V0, a conductive layer B_M1, via layer B_V1, and a conductive layer B_M2 of the back side interconnect structure of the bit cell 102. The back side interconnect structure for the layout 600 is similar to that of the layout 400. The conductive layer B_M1 includes a conductive line BM1_Vss and a conductive line BM1_Vdd extend along the first direction. The conductive line BM1 Vdd is connected to the node 140/BV0_Vdd in the via layer V0 and functions as a routing line to connect the pull-up transistors 114, 122 to the supply voltage Vcc. A conductive via BV1_Vss is formed in the via layer B_V1 and in contact with the conductive line BM1_Vss. The conductive layer B_M2 includes a conductive line BM2_Vss. The conductive line BM2_Vss extends along the second direction across the bit cell 102. The conductive line BM2_Vss, the conductive via BV1_Vss, and the conductive line BM1_Vss form a power mesh connecting the pull-down transistors 118, 124 to the ground.

FIG. 6C schematically demonstrates the word line arrangement of the bit cell 102 and a bit cell 102MY. The bit cell 102MY is disposed to the left of the bit cell 102 and is a mirror image of the bit cell 102 about the Y-axis. As shown in FIG. 6C, the conductive line M2_WL1 is the word line of the bit cell 102 and the conductive line M2_WL2 is the word line of the bit cell 102MY.

Figure 7A:
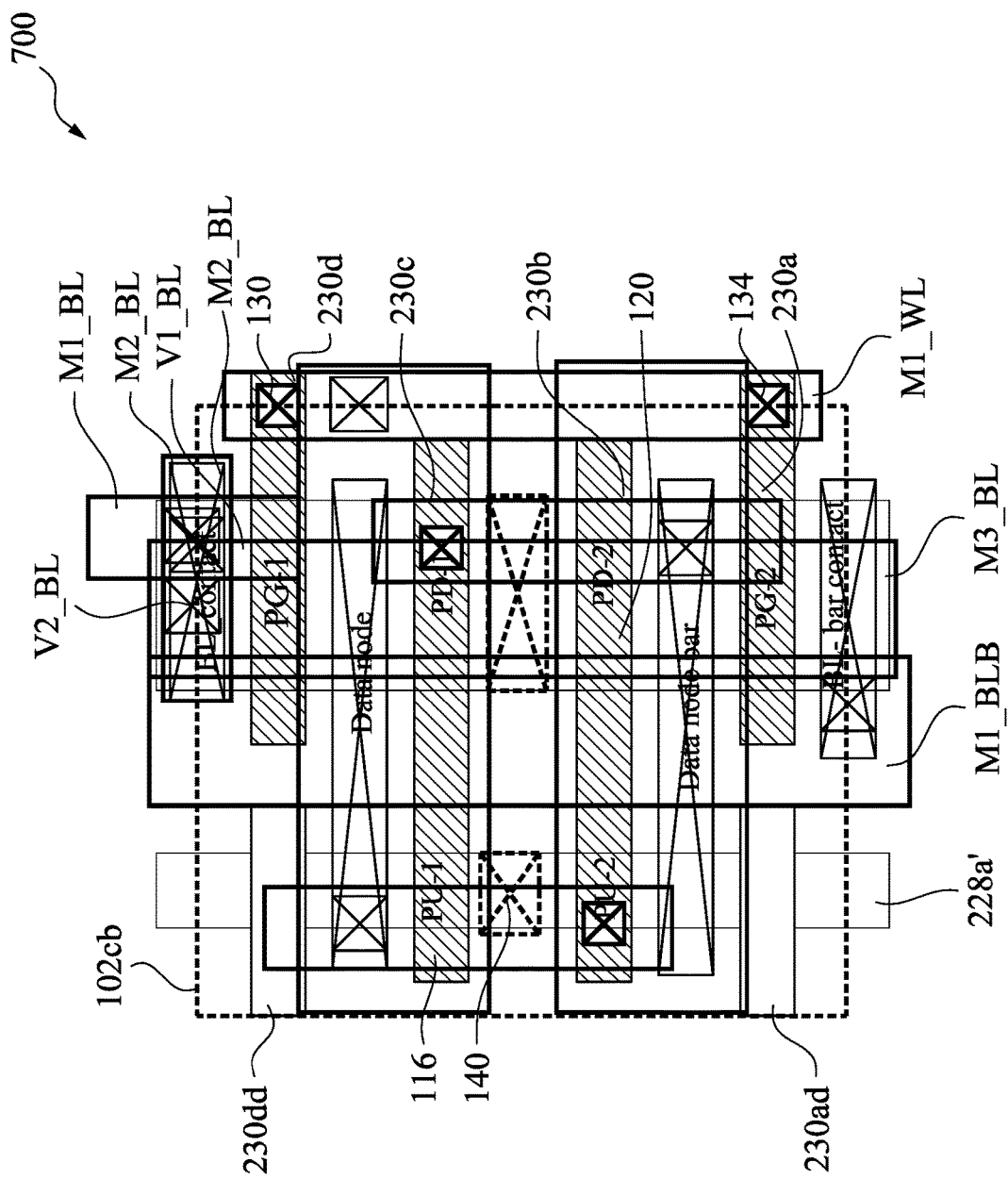
FIG. 7A is a schematic front side interconnect layout for the SRAM bit cell according to the present disclosure.
Figure 7A:
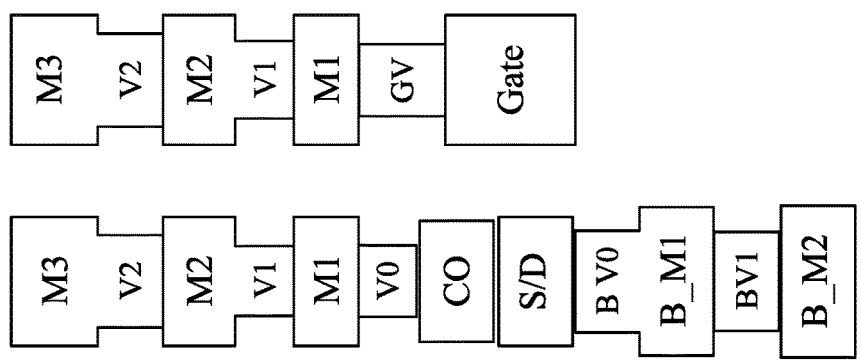
Figure 7B:
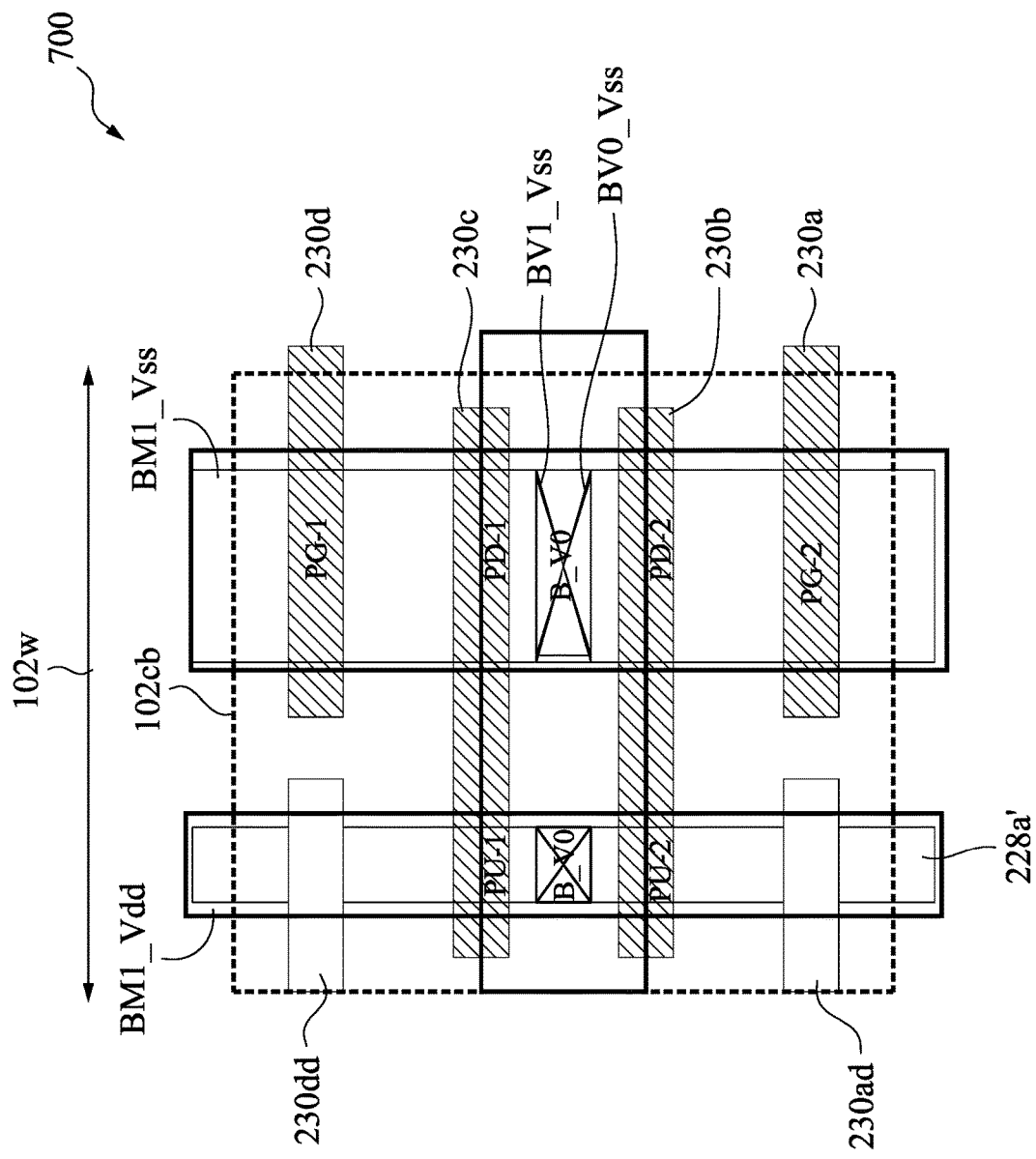
FIG. 7B is a schematic back side interconnect layout for the SRAM bit cell according to the present disclosure.
Figure 7B:
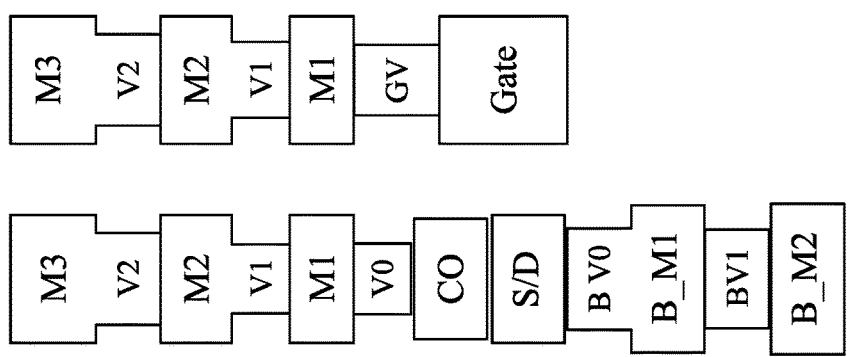

FIG. 7A is a schematic front side layout of the interconnect layout 700 for the SRAM bit cell according to the present disclosure. FIG. 7B is a schematic back side layout of the interconnect layout 700. The interconnect layout 700 is similar to the layout 600 in FIGS. 6A-6C except the layout 600 includes a continuous fin structure 228*a*' over the doped region 226N. The bit cell 102 includes dummy gate structures 230*ad*, 230*dd* formed over the fin structure 228*a*' to electrically isolate source/drain features on opposite sides of the dummy gate structures 230*ad*, 230*dd*.

Figure 8A:
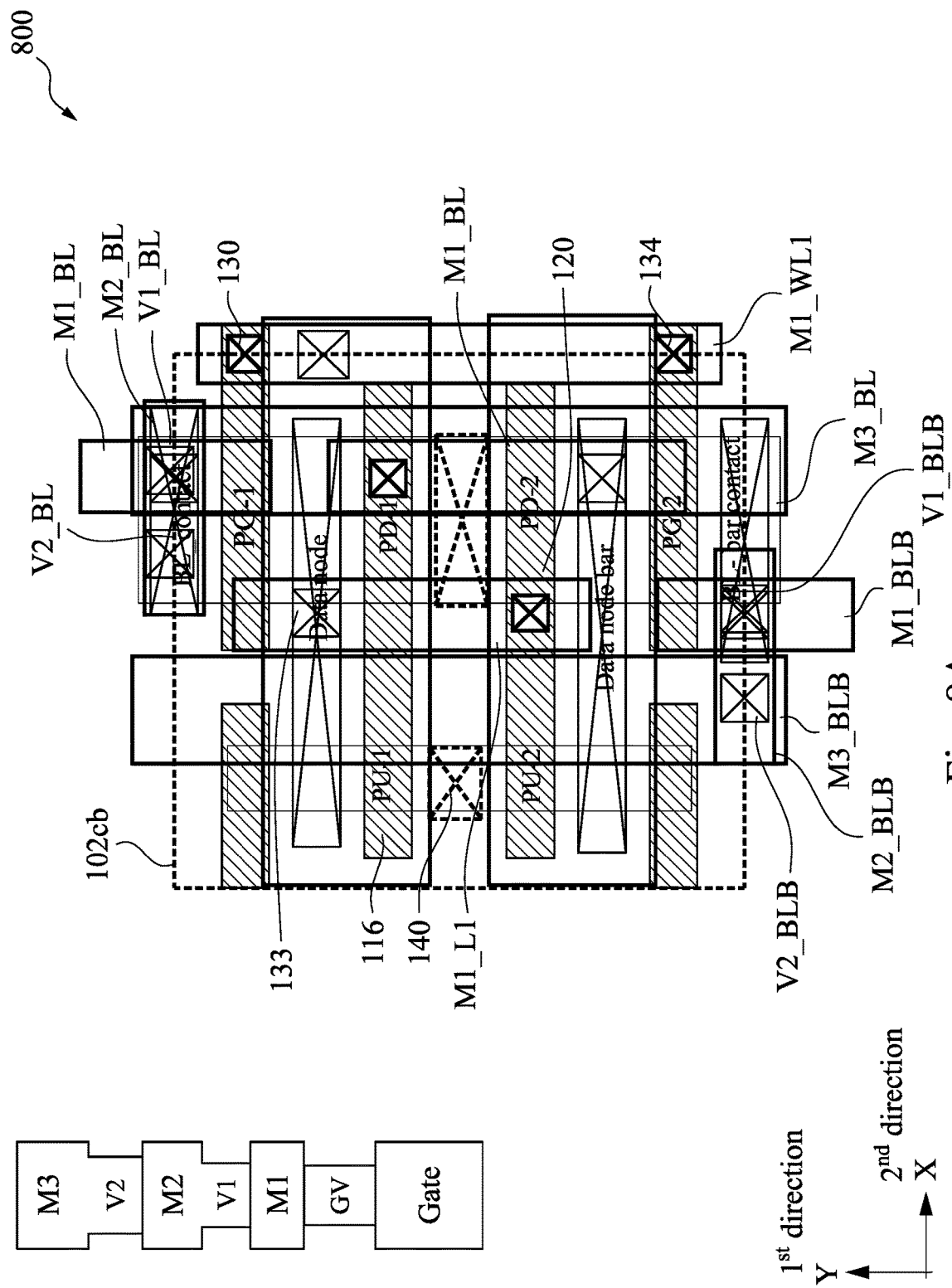
FIG. 8A is a schematic front side interconnect layout for the SRAM bit cell according to the present disclosure.
Figure 8B:
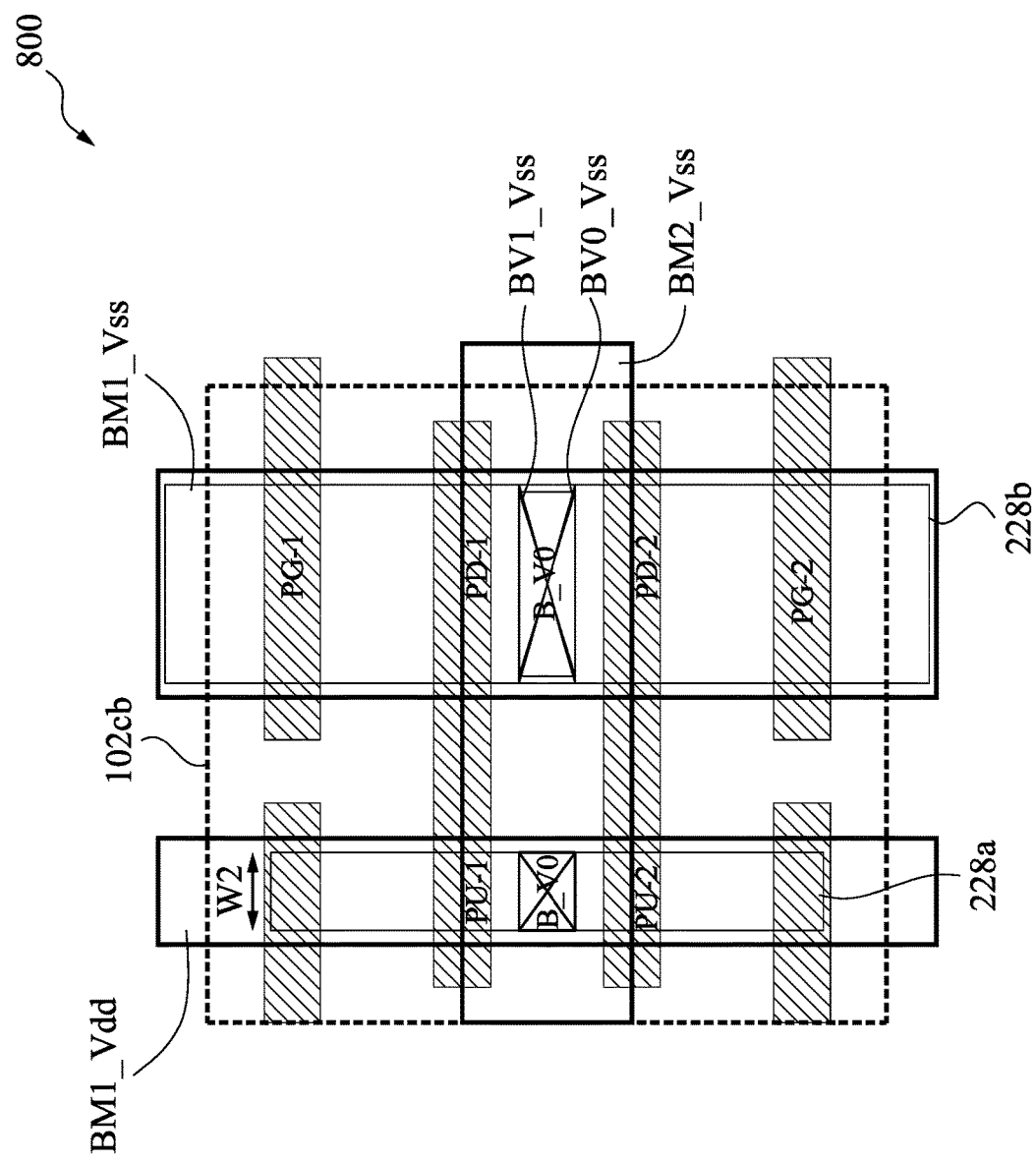
FIG. 8B is a schematic back side interconnect layout for the SRAM bit cell according to the present disclosure.
Figure 8B:
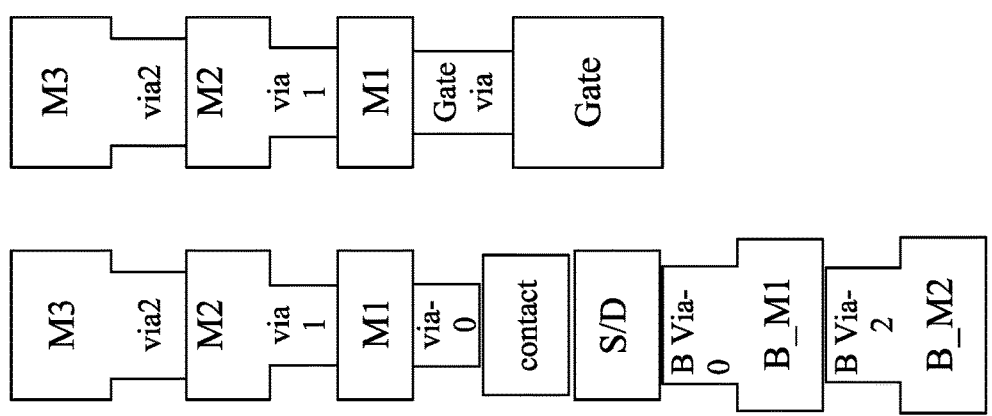
Figure 8C:
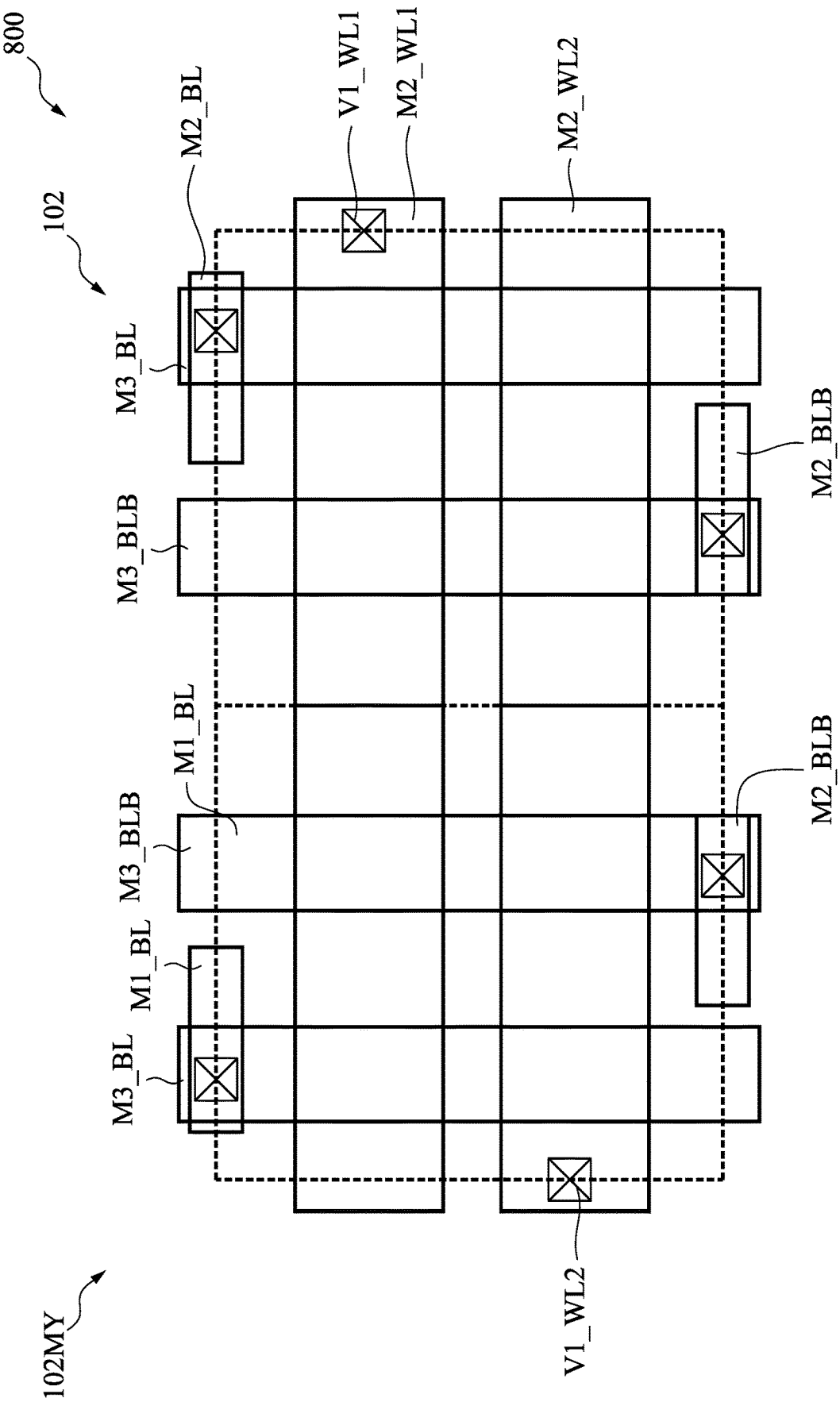
FIG. 8C is a schematic a front side interconnect layout for two SRAM bit cells according to the present disclosure.

FIGS. 8A-8C schematically demonstrate an interconnect layout 800 according to embodiments of the present disclosure. FIG. 8A is a schematic front side layout of the interconnect layout 800 according to the present disclosure. FIG. 8B is a schematic back side layout of the interconnect layout 800. FIG. 8C is a schematic bit line and word line layout of the interconnect layout 800. The interconnect layout 800 is similar to the interconnect layout 600 except that both the bit line conductor and the bit line bar conductor disposed above the word line.

FIG. 8A schematically demonstrates the conductive layers M1, M2, M3 of the front side interconnect structure of the bit cell 102. The first conductive layer M1 include conductive line sections M1_BL and M1_BLB. The conductive line M1_BL is contact with the node 132 in the via layer V0. The conductive line M1_BL is a line section serving as bit line landing in the conductive layer M1. The conductive line M1_BLB is contact with the node 136 in the via layer V0.

The first conductive layer M1 further includes conductive lines M1_L1 and M1 L2 positioned to connect the nodes 116 and 135, and the nodes 120 and 133 respectively. The conductors M1_L1 and M1_L2 are positioned in line with the conductive lines M1_BL and M1_BLB respectively. The first conductive layer M1 further includes a conductive line M1_WL, which is connected to the nodes 130, 134 in the gate via layer GV. The conductive line M1_WL functions word line landing to connect the word line in the upper conductive layer. In some embodiments, the conductive line M1_WL is formed on the cell boundary 102*cb* and shared with the neighboring bit cell.

The via layer V1 is formed over the first conductive layer M1. In some embodiments, a conductive via V1_WL1 is formed in the via layer V1 and in contact with the conductive line M1_WL1. The conductive layer M2 is formed over the via layer V1. The conductive layer M2 includes a conductive line M2_WL1 and a conductive line M2_WL2. The conductive line M2_WL1 and conductive line M2_WL2 are parallel to each other and extend along the first direction. The conductive line M2_WL1 is in electrical connection with the conductive via V1_WL and conductive line M1_WL and functions as the word line for the bit cell 102. The conductive line M2_WL2 is configured to function as the word line for the bit cells on both sides of the bit cell 102 along the x-direction.

In some embodiments, conductive vias V1_BL, V1_BLB are formed in the via layer V1 and in contact with the conductive line M1_BL, M1_BLB respectively. The conductive layer M2 includes conductive line sections M2_BL, M2_BLB. The conductive line sections M2_BL, M2_BLB is connected to the conductive via V1_BL, V1_BLB respectively. The conductive line sections M2_BL, M2_BLB may be line sections extending along the second direction, or parallel to the word lines M2_WL1 and M2_WL2.

The via layer V2 is formed over the second conductive layer M2. In some embodiments, conductive vias V2_BL, V2_BLB are formed in the via layer V2 and in contact with the conductive line sections M2_BL, M2_BLB respectively. The conductive layer M3 is formed over the via layer V2. The conductive layer M3 includes conductive lines M3_BL, M3_BLB. The conductive lines M3_BL, M3_BLB extend across the bit cell 102 along the first direction, and function as the bit line, bit line bar for the bit cell 102, respectively. By moving the bit line and bit line bar away from the first conductive layer M1, the feature density of the first conductive layer M1 may be reduced, and the widths of the bit line and bit line bar may be increased.

FIG. 8B schematically demonstrates arrangement of a via layer B_V0, a conductive layer B_M1, via layer B_V1, and a conductive layer B_M2 of the back side interconnect structure of the bit cell 102. The back side interconnect structure for the layout 800 is similar to that of the layout 600. The conductive layer B_M1 includes a conductive line BM1_Vss and a conductive line BM1 Vdd extend along the first direction. The conductive line BM1 Vdd is connected to the node 140/BV0_Vdd in the via layer V0 and functions as a routing line to connect the pull-up transistors 114, 122 to the supply voltage Vcc. A conductive via BV1_Vss is formed in the via layer B_V1 and in contact with the conductive line BM1_Vss. The conductive layer B_M2 includes a conductive line BM2_Vss. The conductive line BM2_Vss extends along the second direction across the bit cell 102. The conductive line BM2_Vss, the conductive via BV1_Vss, and the conductive line BM1_Vss form a power mesh connecting the pull-down transistors 118, 124 to the ground.

FIG. 8C schematically demonstrates the word line arrangement of the bit cell 102 and a bit cell 102MY. The bit cell 102MY is disposed to the left of the bit cell 102 and is a mirror image of the bit cell 102 about the Y-axis. As shown in FIG. 8C, the conductive line M2_WL1 is the word line of the bit cell 102 and the conductive line M2_WL2 is the word line of the bit cell 102MY.

Figure 9A:
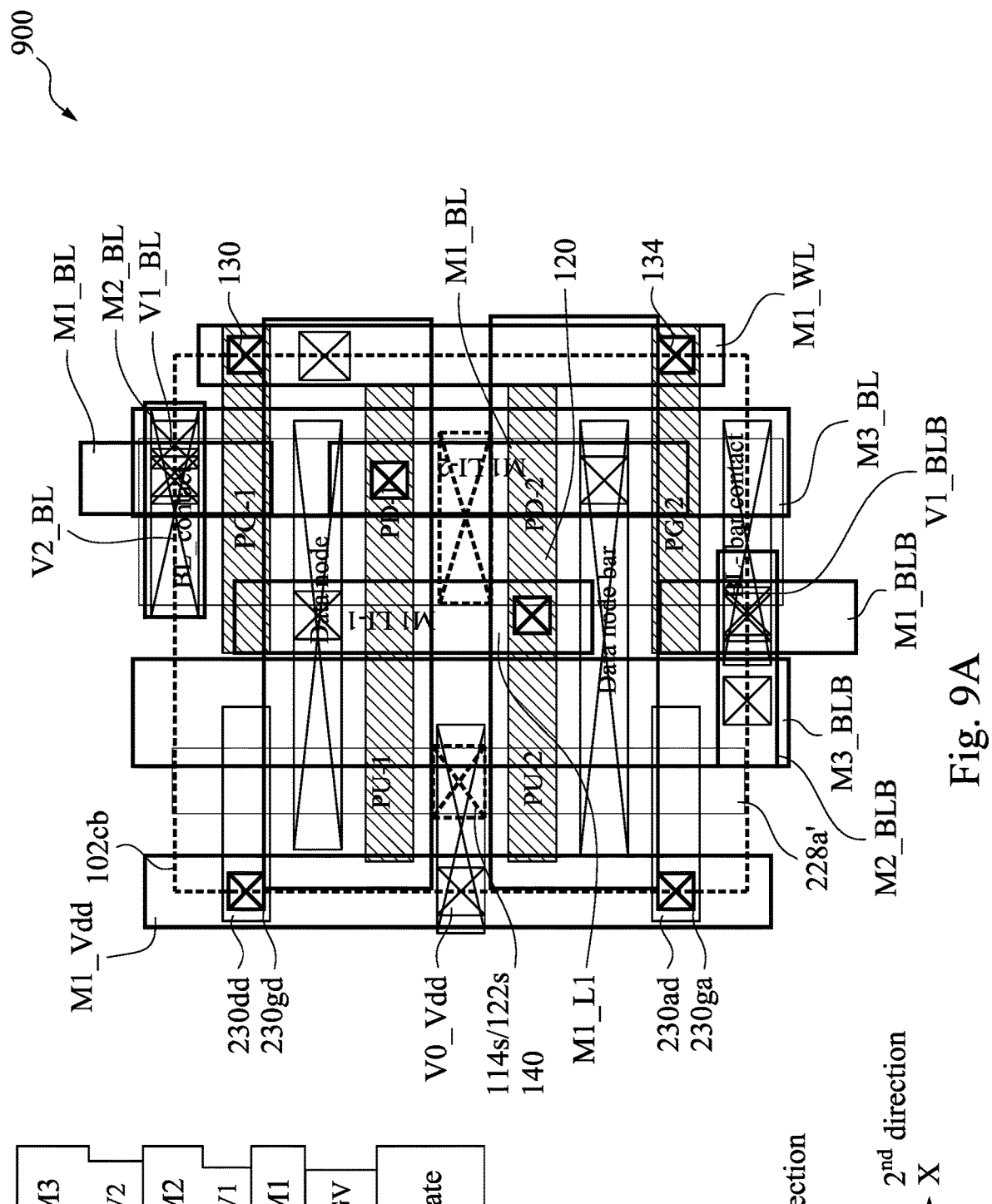
FIG. 9A is a schematic front side interconnect layout for the SRAM bit cell according to the present disclosure.
Figure 9A:
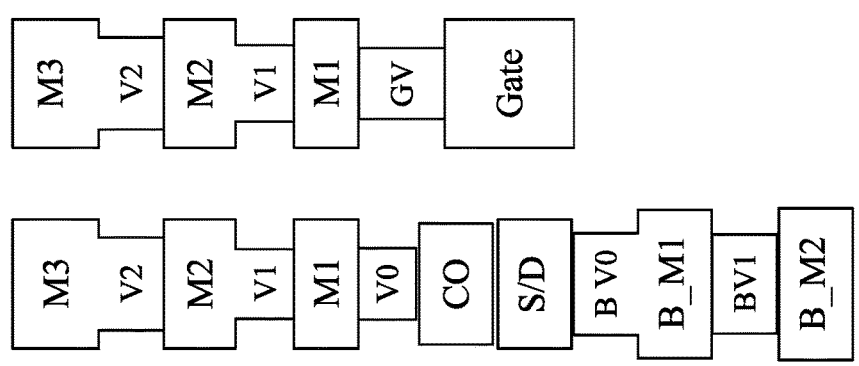
Figure 9B:
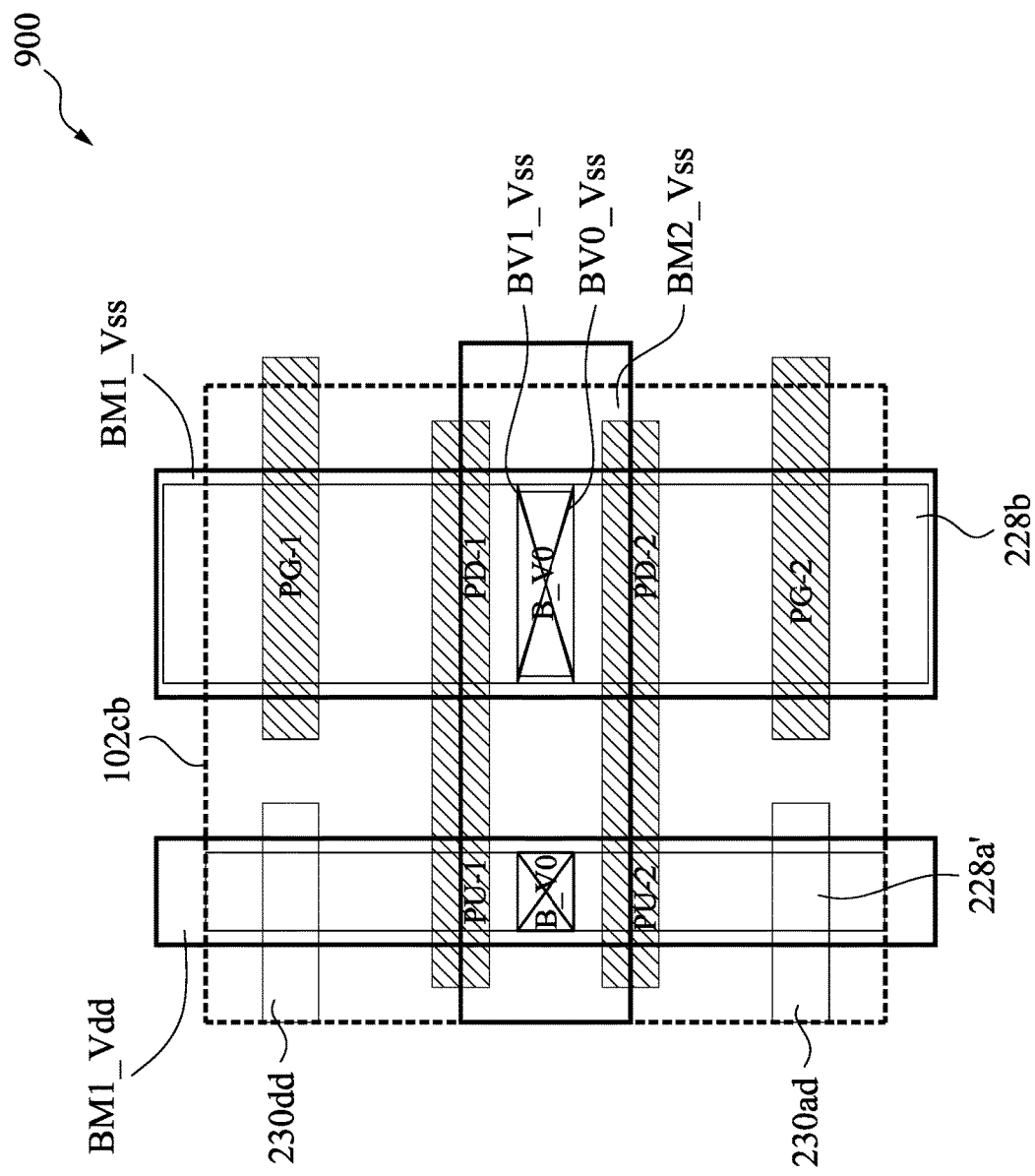
FIG. 9B is a schematic back side interconnect layout for the SRAM bit cell according to the present disclosure.
Figure 9B:
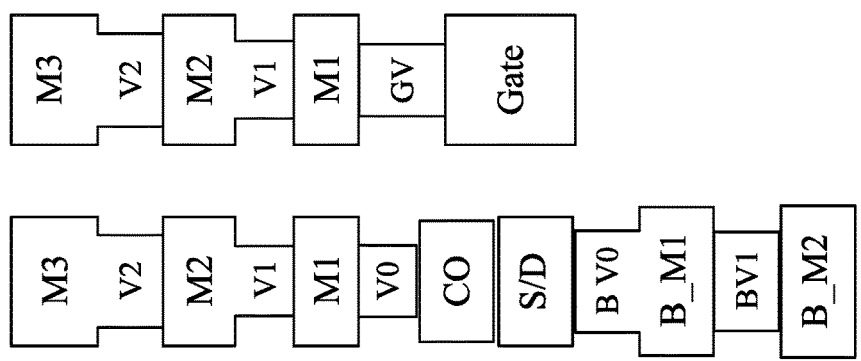

FIG. 9A is a schematic front side layout of the interconnect layout 900 for the SRAM bit cell according to the present disclosure. FIG. 9B is a schematic back side layout of the interconnect layout 900. The interconnect layout 900 is similar to the layout 800 in FIGS. 8A-8C except the layout 900 includes a continuous fin structure 228a' over the doped region 226N. The bit cell 102 includes dummy gate structures 230ad, 230dd formed over the fin structure 228a' to electrically isolate source/drain features on opposite sides of the dummy gate structures 230ad, 230dd. The interconnect layout 900 further includes a front side source/drain contact feature 114s/122s formed in the front side contact layer CO. The source/drain contact feature 114s/122s may extends along the second direction towards the cell boundary. A contact via V0_Vdd is formed in the via layer V0 and in connection with the source/drain contact feature 114s/122s. A conductive line M1 Vdd is formed in the conductive layer M1 and in connection with the contact via V0_Vdd. The conductive line M1_Vdd functions as a second power mesh connecting the pull up transistors 114, 122 to the supply voltage Vcc. In some embodiments, the conductive line M1_Vdd and the contact via V0_Vdd are formed along the cell boundary 102cb and are shared by two neighboring bit cells. In some embodiments, gate contacts 230ga, 230gd are formed between the dummy gate structures 230da, 230dd and the conducive line M1_Vdd so that the dummy gates 230da, 230dd are tied to the supply voltage Vcc.

Figure 10:
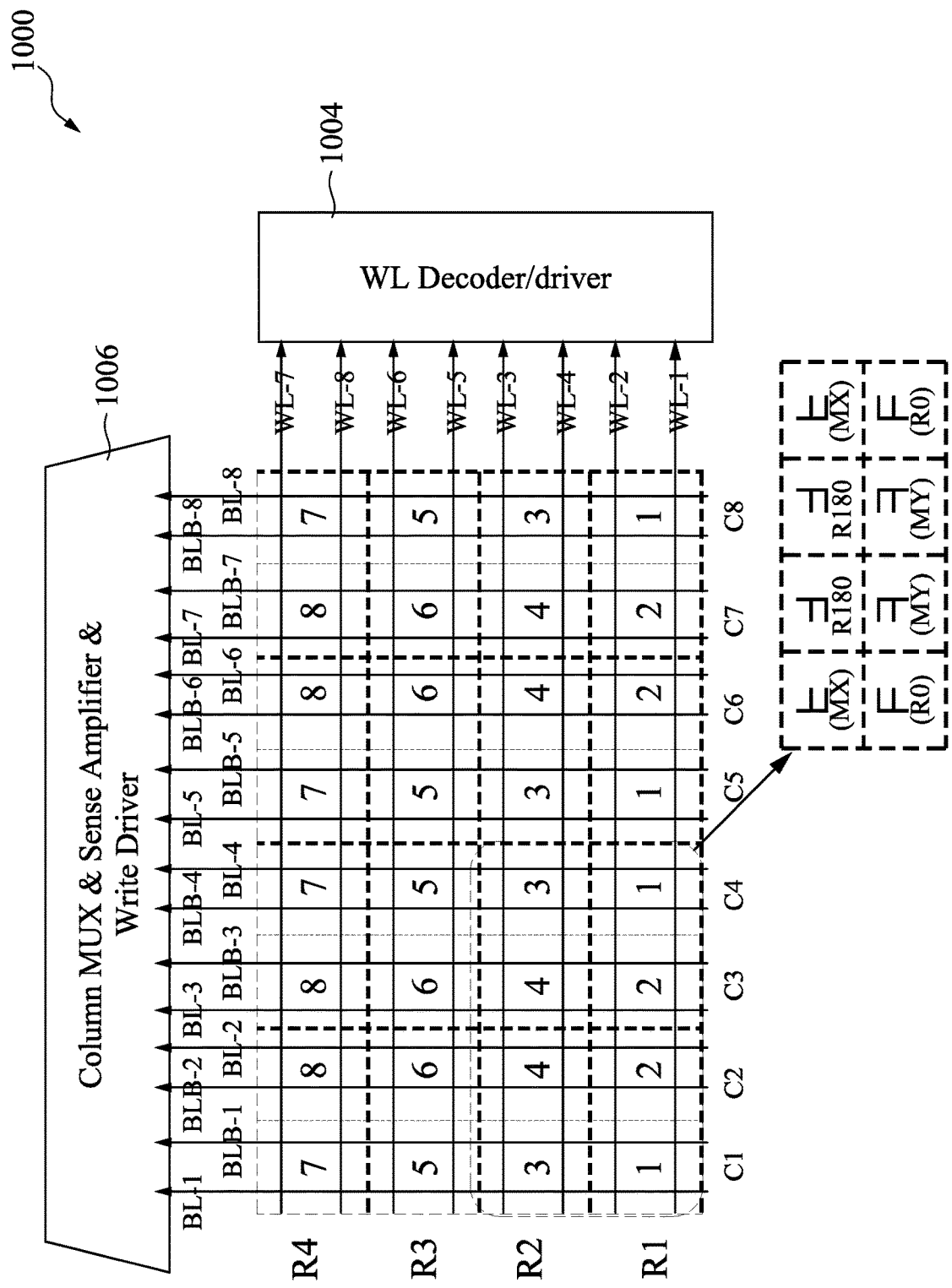
FIG. 10 is a layout of an array of SRAM bit cells according to the present disclosure.

FIG. 10 is a block diagram of a cell array 1000 of the SRAM bit cells according to the present disclosure. The cell array 1000 may be connected to a word line decoder 1004, and a multiplexer and write driver 1006. The word line decoder 1004 and the multiplexer and write driver 1006 are periphery circuit to the memory cell array 1000 and configured to facilitate read and write operation to each bit cell 102 in the memory cell array 1000. In some embodiments, the word line decoder 1004, the multiplexer and write driver 1006 may be logic circuit or devices including components such as inverters, NAND gates, NOR gates, flip-flops, or combinations thereof.

The memory cell array 1000 includes an array of bit cells, such as the bit cell 102 described above. The memory cell array 1000 may include m rows by n columns of the bit cells, where m is an integer corresponding to the number of rows and n is an integer corresponding to the number of columns. In FIG. 10, the cell array 1000 is a 32-bit cell arranged in 4 rows R1, R2, R3, R4 and 8 columns C1-C8.

The bit cells 102 in each column Cn (n is from 1 to 8) share one bit line BL-n, one bit line bar BLB-n. Each row Rm (m is from 1 to 4) has two word lines WL_2m−1, WL_2m. Eight bit cells in two adjacent rows and four adjacent columns form a unit. The eight bit cells in the unit are arranged in a mirror symmetric manner as shown in FIG. 10. In the 32-bit arrangement, each word line WL extends across eight columns the bit cells 102, but is connected to four bit cells in the row. Each bit line and bit line bar extend across four bit cells and is connected to four bit cells.

Figure 11:
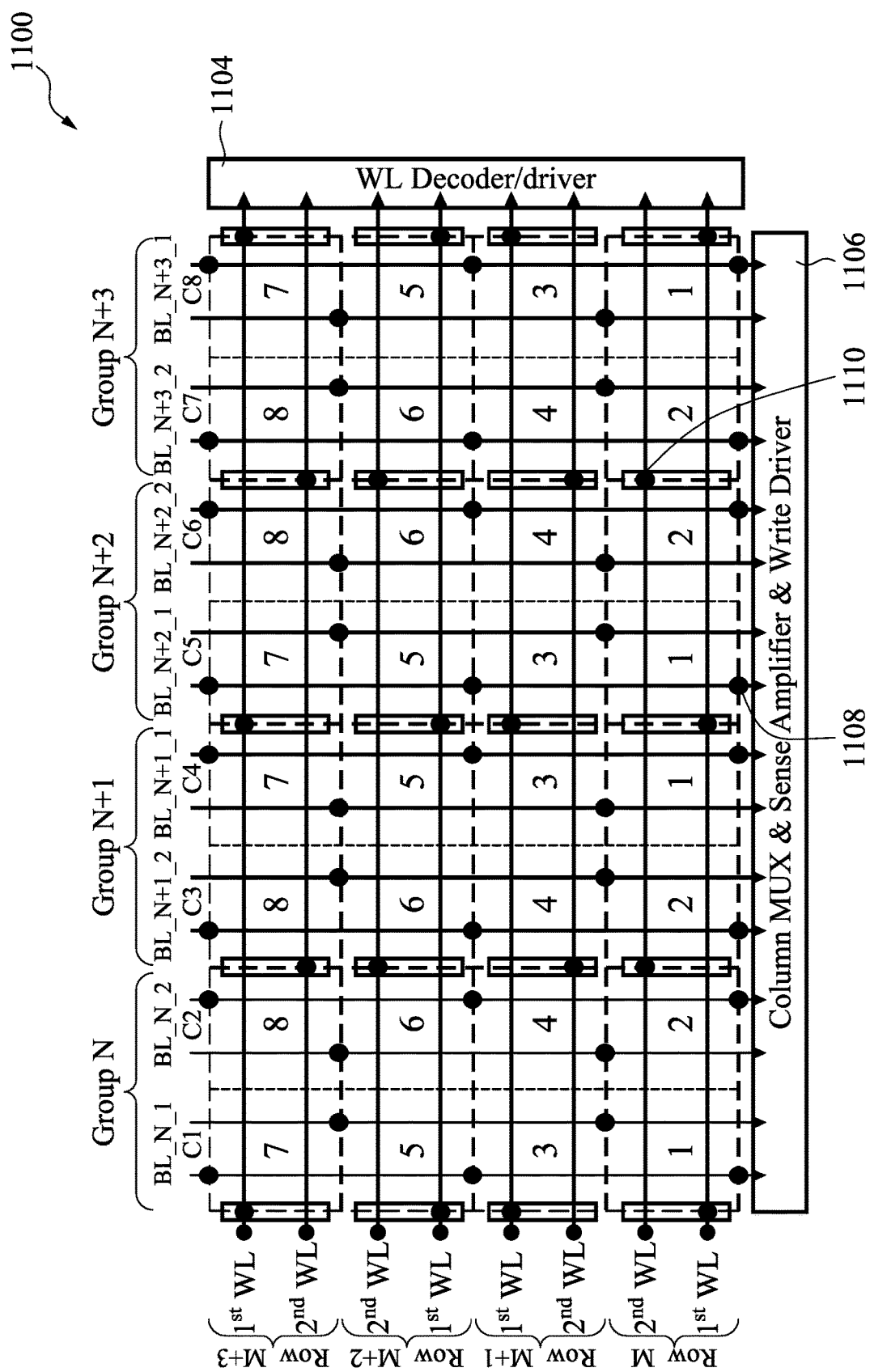
FIG. 11 is a layout of an array of SRAM bit cells according to the present disclosure

FIG. 11 is a partial layout of a cell array 1100 of SRAM bit cells according to the present disclosure. The cell array 1100 may be connected to a word line decoder 1104, and a multiplexer and write driver 1106. The memory cell array 1100 includes an array of bit cells, such as the bit cell 102 described above. The memory cell array 1100 may include m rows by n columns of the bit cells. Every two columns form a group. The two columns in each group are mirror images of each other about the central line. Neighboring groups are mirror images of each other. FIG. 11 schematically demonstrates Group N, Group N+1, Group N+2, Group N+3 in Row M, Row M+1, Row M+2, Row M+3. Nodes 1108 are bit line/bit line bar landing in the bit cell.

Nodes 1110 are word line landing in the bit cell. In each unit of 32-bit cells, the word line, bit line, and bit line bar each carry 4 bit cells, resulting in faster reading and writing as compared to the conventional 32 bit cells where each bit line and bit line bar carries 8 bit cells.

Various embodiments or examples described herein offer multiple advantages over the state-of-art technology. The bit cell structure according to the present disclosure use two fin structures, instead of four, to enable further cell scaling. All N-type MOSFETs (PG/PD) are forming upon same doped region providing fully symmetry devices layout for cell stability improvement. Positioning power mesh Move Vss and/or Vdd conductors to the back-side reduces the routing loading as well as cell size further reduction. The reduced conductive lines in a given area also benefits the conductor RC performance, by lowering resistance with wider conductor, lowering Capacitance with larger spacing, or both. Embodiments of the present disclosure uses two horizontal (WL routing direction) adjacent cells grouped together to mimic two rows in one column design for bit-line RC reduction. Some embodiments place bit-line and bit-line-bar on different metal layers to achieve both low resistance and low capacitance requirements. Some embodiments place the bit-line and bit-line bar to a higher-level conductive layer for resistance reduction. Embodiments of the present disclosure also provide a more robustness power mesh in SRAM cell region by using a back side power mesh.

It will be understood that not all advantages have been necessarily discussed herein, no particular advantage is required for all embodiments or examples, and other embodiments or examples may offer different advantages.

Some embodiments of the present provide a memory cell comprising a device layer comprising: first and second fin structures extending along a first direction; first, second, third, and fourth gate structures extending along a second direction, wherein the second direction is substantially perpendicular to the first direction; a front side interconnect structure disposed above the device layer, wherein the front side interconnect structure includes: a bit line extending along the first direction; a bit line bar extending along the first direction; and a first word line extending the second direction; a back side interconnect structure includes: a voltage supply line; and a ground line.

Some embodiments of the present disclosure provide a SRAM (static random-access memory) bit cell, comprising a first doped region having a first pull-up transistor and a second pull-up transistor formed thereon; a second doped region having a first pass transistor, a second pass transistor, a first pull down transistor, and a second pull down transistor, wherein the first pass transistor, the first pull down transistor, the second pull down transistor and the second pass transistor are linearly arranged in the second doped region; a first front side conductive layer having a bit line bar conductor formed therein; a second front side conductive layer having a word line conductor formed therein; a first back side conductive layer having a supply voltage line formed therein; and a second back side conductive layer having a ground line formed therein.

Some embodiments of the present disclosure provide an integrated circuit chip, comprising: an array of memory bit cells arranged in columns and rows, wherein each memory bit cell comprises: first and second fin structures along a first direction; and first, second, third, and fourth gate structures parallelly arranged along a second direction, wherein the second direction is substantially perpendicular to the first direction; a bit line conductor disposed along the first direction; a bit line bar conductor disposed along the first direction; a first word line along the second direction; a second word line along the second direction, wherein the first word line is electrically connected to the bit cell, and the second word line is connected to the adjacent bit cell in the same row; a supply voltage line; and a ground line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory bit cell, comprising:
a device layer comprising:
   a first fin structure and a second fin structure each extending along a first direction; and
   a first gate structure, a second gate structure, a third gate structure, and a fourth gate structure each extending along a second direction and sequentially arranged in the first direction, wherein:
      the second direction is substantially perpendicular to the first direction, and
      the first gate structure, the second gate structure, the third gate structure, and the fourth gate structure each overlie the first fin structure and the second fin structure;
a front side interconnect structure disposed above the device layer, wherein the front side interconnect structure comprises:
   a bit line extending along the first direction;
   a bit line bar extending along the first direction;
   a word line landing extending along the first direction and overlying at least the first gate structure and the fourth gate structure; and
   a first word line extending along the second direction and electrically connected to the word line landing; and
a back side interconnect structure comprising:
   a voltage supply line; and
   a ground line.

2. The memory bit cell of claim 1, wherein the front side interconnect structure further comprises a second word line extending along the second direction.

3. The memory bit cell of claim 1, further comprising:
a first line section and a second line section each disposed in a first conductive layer, wherein:
   the first line section is in electrical communication with the bit line,
   the second line section is in electrical communication with the bit line bar,
   the first word line is disposed in a second conductive layer, and
   the bit line and the bit line bar are disposed in a third conductive layer.

4. The memory bit cell of claim 3, further comprising:
a front side voltage supply line disposed in the first conductive layer.

5. The memory bit cell of claim 1, wherein:
the bit line bar and the bit line are disposed in different conductive layers,
the bit line bar is disposed in a first conductive layer,
the first word line is disposed in a second conductive layer, and
the bit line is disposed in a third conductive layer.

6. The memory bit cell of claim 1, wherein the first fin structure is a continuous fin structure and intersects with the first gate structure, the second gate structure, the third gate structure, and the fourth gate structure.

7. The memory bit cell of claim 6, wherein the second fin structure is sectional and intersects with the second gate structure and the third gate structure.

8. The memory bit cell of claim 6, further comprising:
a first dummy gate aligning with the first gate structure; and
a second dummy gate aligning with the fourth gate structure, wherein:
   the second fin structure is a continuous fin structure, and
   the second fin structure intersects with the first dummy gate, the second gate structure, the third gate structure, and the second dummy gate.

9. The memory bit cell of claim 8, further comprising:
a front side voltage supply line extending along the first direction and disposed in a conductive layer, wherein the first dummy gate and the second dummy gate are electrically connected to the front side voltage supply line.

10. A SRAM (static random-access memory) bit cell, comprising:
a first doped region having a first pull-up transistor and a second pull-up transistor formed thereon, wherein the first pull-up transistor and the second pull-up transistor share a first fin structure having a first width;
a second doped region having a first pass transistor, a second pass transistor, a first pull down transistor, and a second pull down transistor, wherein:
   the first pass transistor, the first pull down transistor, the second pull down transistor, and the second pass transistor are linearly arranged in the second doped region, and
   the first pass transistor, the first pull down transistor, the second pull down transistor, and the second pass transistor share a second fin structure having a second width greater than the first width;
a first front side conductive layer having a bit line bar conductor formed therein;
a second front side conductive layer having a word line conductor formed therein;
a first back side conductive layer having a supply voltage line formed therein; and
a second back side conductive layer having a ground line formed therein.

11. The SRAM bit cell of claim 10, wherein the first front side conductive layer is disposed over the first doped region and the second doped region and under the second front side conductive layer.

12. The SRAM bit cell of claim 10, wherein the second front side conductive layer is disposed over the first doped region and the second doped region and under the first front side conductive layer.

13. The SRAM bit cell of claim 10, further comprising:
a third front side conductive layer having a bit line conductor formed therein, wherein the second front side conductive layer is disposed between the first front side conductive layer and the second front side conductive layer.

14. The SRAM bit cell of claim 10, wherein:
the first front side conductive layer comprises a first conductive line and a second conductive line formed therein,
the first conductive line is connected to a gate electrode of the first pull-up transistor, and
the second conductive line is connected to a gate electrode to the second pull-up transistor.

15. An integrated circuit chip, comprising:
an array of memory bit cells arranged in columns and rows, wherein each memory bit cell comprises:
   a first fin structure and a second fin structure extending along a first direction;
   a first gate structure, a second gate structure, a third gate structure, and a fourth gate structure parallelly arranged along a second direction, wherein the second direction is substantially perpendicular to the first direction;
   a bit line conductor extending along the first direction;
   a bit line bar conductor extending along the first direction;
   a first word line extending along the second direction;
   a second word line extending along the second direction, wherein:
     the first word line is electrically connected to the memory bit cell, and
     the second word line is connected to an adjacent memory bit cell of the array of memory bit cells in a same row;
   a supply voltage line extending along the first direction and underlying the first fin structure; and
   a ground line.

16. The integrated circuit chip of claim 15, wherein the bit line conductor, the bit line bar conductor, and the first word line are disposed above the first gate structure, the second gate structure, the third gate structure, and the fourth gate structure, and the supply voltage line and the ground line are disposed below the first gate structure, the second gate structure, the third gate structure, and the fourth gate structure.

17. The integrated circuit chip of claim 16, wherein:
the bit line bar conductor is formed in a first front side conductive layer, and
the first word line and the second word line are formed in a second front side conductive layer.

18. The integrated circuit chip of claim 17, wherein the bit line conductor is formed in a third front side conductive layer.

19. The memory bit cell of claim 1, wherein the word line landing is electrically connected to the first gate structure through a first conductive via and is electrically connected to the fourth gate structure through a second conductive via.

20. The memory bit cell of claim 1, wherein the voltage supply line extends along the first direction and underlies the first fin structure.

* * * * *